(12) United States Patent
Shin et al.

(10) Patent No.: US 9,006,840 B2
(45) Date of Patent: Apr. 14, 2015

(54) SEMICONDUCTOR DEVICE AND SEMICONDUCTOR SYSTEM INCLUDING THE SAME

(71) Applicant: SK Hynix Inc., Gyeonggi-do (KR)

(72) Inventors: Sang-Hoon Shin, Gyeonggi-do (KR); Young-Ju Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/107,958

(22) Filed: Dec. 16, 2013

(65) Prior Publication Data

US 2014/0291855 A1 Oct. 2, 2014

(30) Foreign Application Priority Data

Apr. 2, 2013 (KR) ........................ 10-2013-0035540

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 23/48 | (2006.01) |
| H03K 19/00 | (2006.01) |

(52) U.S. Cl.
CPC .............. *H01L 23/481* (2013.01); *H03K 19/00* (2013.01); *H01L 2924/0002* (2013.01); *H01L 2224/16145* (2013.01)

(58) Field of Classification Search
USPC ......... 257/396, 277, 265, 499, 506, 622, 701, 257/728, 774, E21.006, E21.267, E21.278, 257/E21.293, E21.327, E21.499, E21.546
See application file for complete search history.

(56) References Cited

U.S. PATENT DOCUMENTS

| 8,148,814 B2* | 4/2012 | Furuta et al. ................... 257/723 |
| 8,421,243 B2* | 4/2013 | Sasaki et al. ................... 257/777 |
| 2010/0200998 A1* | 8/2010 | Furuta et al. ................... 257/774 |

* cited by examiner

*Primary Examiner* — David Nhu
(74) *Attorney, Agent, or Firm* — IP & T Group LLP

(57) ABSTRACT

A semiconductor device includes a plurality of semiconductor chips in a stack structure and a through-silicon via suitable for passing through the chips and transfer a signal from or to one or more of the chips. Each of the chips includes a buffering block disposed in path of the through-silicon via, and suitable for buffering the signal, an internal circuit, and a delay compensation block suitable for applying delay corresponding to the buffering blocks of the chips to the signal, wherein the delay compensation blocks of the chips compensates for delay difference of the signal transferred to and from the internal circuit of the chip, due to operations of the buffering block, based on stack information for distinguishing the chips.

20 Claims, 11 Drawing Sheets

SEMICONDUCTOR DEVICE AND SEMICONDUCTOR SYSTEM INCLUDING THE SAME

CROSS-REFERENCE TO RELATED APPLICATIONS

The present application claims priority of Korean Patent Application No. 10-2013-0035540, filed on Apr. 2, 2013, which is incorporated herein by reference in its entirety.

BACKGROUND

1. Field

Exemplary embodiments relate to a semiconductor design technology, and more particularly, to a signal transmission technology in a semiconductor device with a stack structure.

2. Description of the Related Art

In order to highly integrate a semiconductor device, various types of packages have been suggested. In particular, in a chip stack type in which a plurality of semiconductor chips are stacked to constitute one semiconductor device, through-semiconductor chip lines are commonly employed to transfer a signal to the plurality of semiconductor chips. In general, since a semiconductor chip is fabricated using a silicon wafer, the through-semiconductor chip lines are referred to as through-silicon vias (TSVs).

FIG. 1 is a conceptual configuration diagram of a semiconductor device that is configured by stacking a plurality of semiconductor chips.

Referring to FIG. 1, a semiconductor device includes a plurality of semiconductor chips, SLICE0, SLICE1 and SLICE2 that are stacked. For reference, FIG. 1 conceptually shows one of various chip stack ways.

The chips SLICE0 to SLICE2 transfer signals among them through through-silicon vias TSV1, TSV2 and TSV3. Repeaters TX and RX are disposed in the respective semiconductor chips SLICE0 to SLICE2 to buffer signals that are transmitted through the TSV1, TSV2 and TSV3.

Even if signals among the chips SLICE0 to SLICE2 may be transmitted through the TSV1, TSV2 and TSV3, one of issues that make it difficult to stack a large number of semiconductor chips resides in operation delay of the repeaters TX and RX for buffering signals of the respective semiconductor chips SLICE0 to SLICE2. That is to say, when transmitting signals, signals reach the chips SLICE0 to SLICE2 at times different from one another due to the operation delay of the repeaters TX and RX.

For example, when the operation speed of repeaters TX and RX of one stage is 200 ps in four-staged stack structure, a delay difference between a lowermost stacked semiconductor chip ("lowermost chip") and an uppermost stacked semiconductor chip ("uppermost chip") may reach 600 ps. Assuming that the frequency of an operating clock provided to the chips is 500 MHz, even with a structure in which a plurality of semiconductor chips are simply stacked, a concern is caused in that the delay of a signal may correspond to a half cycle (half tCK).

In other words, when operating at a high speed the device that has the stack structure with the chips SLICE0 to SLICE2, a concern is caused in that operational stability may not be secured, for example, due to the operation delay caused by the repeaters TX and RX that are disposed among the respective semiconductor chips SLICE0 to SLICE2.

SUMMARY

Various exemplary embodiments are directed to a delay compensation circuit that may compensate for the delay of a signal transmitted through TSVs in a semiconductor device with a stack structure.

In accordance with an exemplary embodiment of the present invention, a semiconductor device may include a plurality of semiconductor chips in a stack structure and a through-silicon via suitable for passing through the chips and transfer a signal from or to one or more of the chips, wherein each of the chips includes a buffering block disposed in path of the through-silicon via, and suitable for buffering the signal, an internal circuit, and a delay compensation block suitable for applying delay corresponding to the buffering blocks of the chips to the signal, wherein the delay compensation blocks of the chips compensates for delay difference of the signal transferred to and from the internal circuit of the chip, due to operations of the buffering block, based on stack information for distinguishing the chips.

In accordance with another exemplary embodiment of the present invention, a semiconductor device may include a plurality of semiconductor chips in a stack structure, a first through-silicon via suitable for passing through the chips and transfer a first signal from or to one or more of the chips, and a second through-silicon via suitable for passing through the chips and transfer a second signal from or to one or more of the chips, wherein each of the chips includes a first buffering block and second buffering block respectively disposed in path of the first and second through-silicon vias, and suitable for buffering the signals, an internal circuit, and a first delay compensation block and second delay compensation block suitable for applying delay corresponding to the first and second buffering blocks of the chips to the respective signals, wherein the first delay compensation block and second delay compensation block of the chips compensate for delay difference of the respective signals transferred to and from the internal circuit of the chip, due to operations of the first and second buffering blocks, based on stack information for distinguishing the chips.

In accordance with still another exemplary embodiment of the present invention, a semiconductor system may include a semiconductor device and a semiconductor controller, wherein the device includes a plurality of semiconductor chips in a stack structure, and a through through-silicon via suitable for passing through the chips and transfer a signal from or to one or more of the chips, and wherein the controller communicates the signal with the device and compensates for delay differences of the signal transmitted through the through-silicon via based on stack information for distinguishing the chips.

Exemplary embodiments of the present invention may compensate for the delay of a signal transmitted through TSVs in a semiconductor device with a stack structure.

As a consequence, it may be possible to effectively support an operation with a high bandwidth even in the semiconductor device with a stack structure.

DETAILED DESCRIPTION

Figure 1:
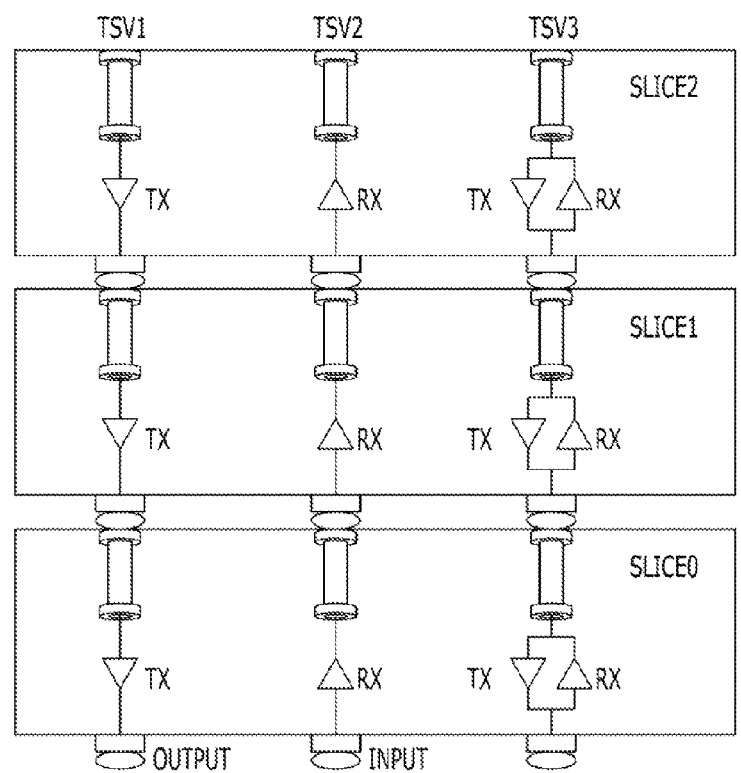
FIG. 1 is a conceptual configuration diagram of a semiconductor device that is configured by stacking a plurality of semiconductor chips.

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. Also, it is noted that in this specification, "connected/coupled" refers to one component not only directly coupling another component but also indirectly coupling another component through an intermediate component. In addition, a singular form may include a plural form as long as it is not specifically mentioned in a sentence.

<First Embodiment>

Figure 2A:
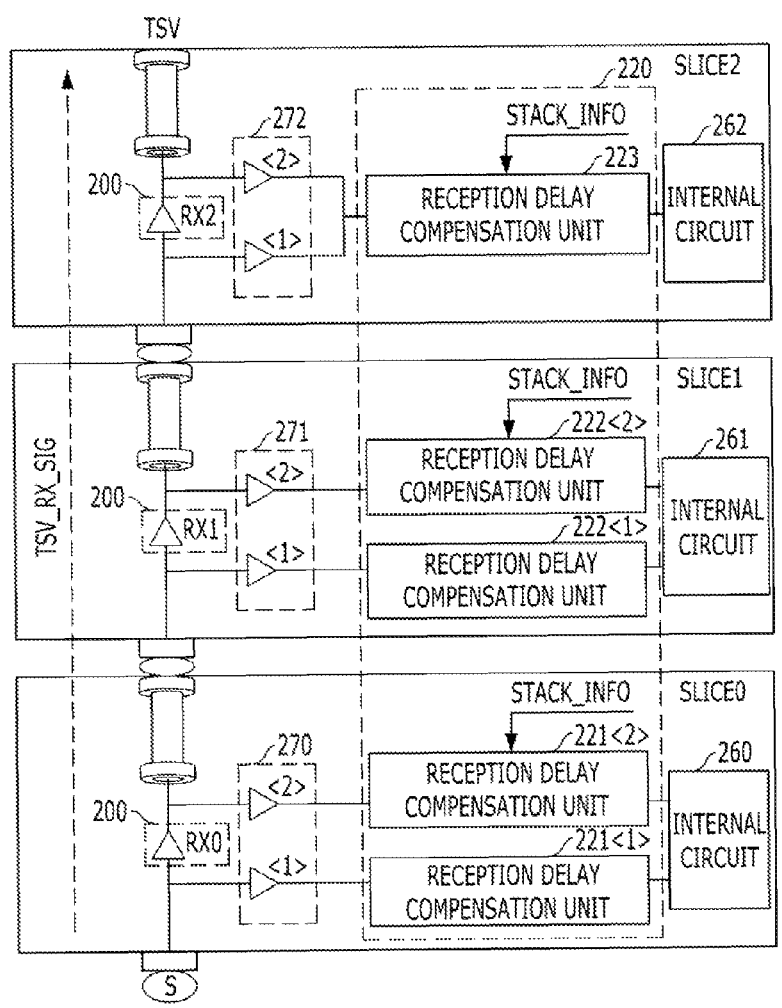
FIGS. 2A and 2B are conceptual configuration diagrams of a semiconductor device that is configured by stacking a plurality of semiconductor chips, in accordance with a first embodiment of the present invention.
Figure 2B:
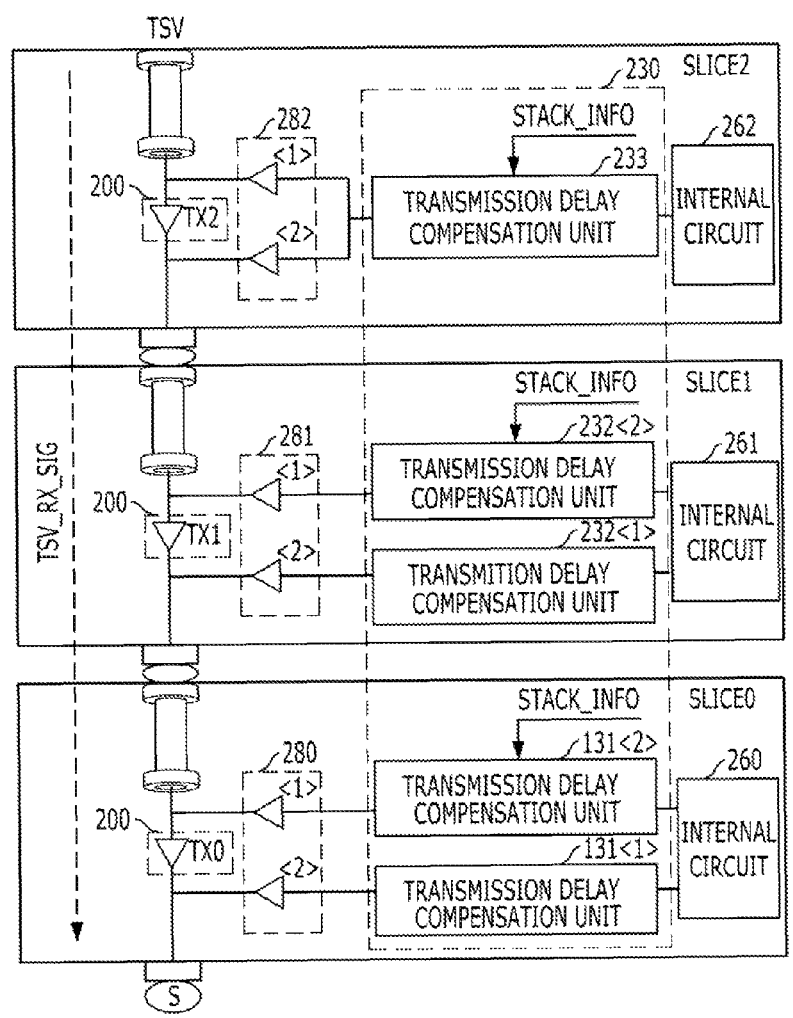

FIGS. 2A and 2B are conceptual configuration diagrams of a semiconductor device that is configured by stacking a plurality of semiconductor chips, in accordance with a first embodiment of the present invention.

Referring to FIGS. 2A and 2B, a semiconductor device with a plurality of semiconductor chips forming a stack structure includes a circuit for compensating for the delay of a signal to be received or transmitted in accordance with the first embodiment. The number of the semiconductor chips described below may vary according to a circuit design, and may be modified by those skilled in the art with ease.

Referring to FIGS. 2A and 2B, the device in accordance with the first embodiment includes a plurality of semiconductor chips SLICE0 to SLICE2, buffering blocks 200, delay compensation blocks 220 and 230, a plurality of reception blocks 270, 271 and 272, a plurality of transmission blocks 280, 281 and 282, and internal circuits 260, 261 and 262. The buffering blocks 200 include a plurality of input buffers RX0, RX1 and RX2 and a plurality of output buffers TX0, TX1 and TX2. Also, the delay compensation blocks 220 and 230 include a plurality of reception delay compensation units 221, 222 and 223 and a plurality of transmission delay compensation units 231, 232 and 233, respectively.

In detail, the device in accordance with the first embodiment includes the chips SLICE0 to SLICE2, which are configured in a stack type and transmit signals TSV_RX_SIG and TSV_TX_SIG through TSV, the buffering blocks 200 in respective correspondence to the chips SLICE0 to SLICE2, which are disposed in the paths of the TSV and are configured to buffer the signals TSV_RX_SIG and TSV_TX_SIG transferred through the TSV, and the delay compensation blocks 220 and 230, which are configured to compensate for delay differences, which are caused by the buffering blocks 200, in timings at which the signals TSV_RX_SIG and TSV_TX_SIG are transferred to each of the chips SLICE0 to SLICE2 based on stack information STACK_INFO for distinguishing the chips SLICE0 to SLICE2. The device further includes the reception blocks 270, 271 and 272, which are disposed in the corresponding chips SLICE0 to SLICE2, and are configured to input the signals TSV_RX_SIG between the internal circuits 260, 261 and 262 and the TSV. The device further includes the transmission blocks 280, 281 and 282, which are disposed in the respective semiconductor chips SLICE0 to SLICE2, and are configured to output the signals TSV_TX_SIG between the internal circuits 260, 261 and 262 and the TSV.

The delay compensation block 220 includes the reception delay compensation units 221, 222 and 223, which are respectively disposed between the internal circuits 260, 261 and 262 and the respective reception blocks 270, 271 and 272. Delay for compensation of the plurality of reception delay compensation units 221, 222 and 223 are respectively determined based on the stack information STACK_INFO on the basis of a delay timing difference of the signal TSV_RX_SIG from the lowermost chip SLICE0 to the uppermost chip SLICE2, wherein the delay timing difference of the signal TSV_RX_SIG may vary according to selective enablement of the chips SLICE0 to SLICE2. The delay compensation block 230 further includes the transmission delay compensation units 231, 232 and 233, which are respectively disposed between the internal circuits 260, 261 and 262 and the plurality of respective transmission blocks 280, 281 and 282. Delay for compensation of the transmission delay compensation units 231, 232 and 233 are respectively determined based on the stack information STACK_INFO on the basis of a delay timing difference of the signal TSV_TX_SIG from the uppermost chip SLICE2 to the lowermost chip SLICE0, wherein the delay timing difference of the signal TSV_TX_SIG may vary according to selective enablement of the chips SLICE0 to SLICE2.

For example, in the case where only three chips are selectively enabled in a semiconductor device with five semiconductor chips forming a stack structure, a number of actual or logical chips, an uppermost chip and a lowermost chip should be identified among the three chips or the selectively enabled chips. In this way, the number, the uppermost chip, and the lowermost chip of physically stacked semiconductor chips may be different from those of logically stacked semiconductor chips according to selective enablement of the chips.

The stack information STACK_INFO may be set through an internally disposed memory register set (MRS), fuse setting, or a test mode.

The buffering blocks 200 include the input/output buffers RX0, RX1, RX2, TX0, TX1 and TX2, which are disposed in the plurality of respective semiconductor chips SLICE0 to SLICE2 and are configured to buffer the signals TSV_RX_SIG and TSV_TX_SIG. The input/output buffers RX0, RX1, RX2, TX0, TX1 and TX2 are respectively enabled based on the stack information STACK_INFO.

For example, in the case where the signal TSV_RX_SIG from an outside is applied only to the lowermost chip SLICE0, an operation may be performed in such a manner that the input buffer RX0 corresponding to the lowermost chip SLICE0 is selectively enabled and the input buffers RX1 and RX2 corresponding to the remaining semiconductor chips SLICE1 and SLICE2 are disabled. When the signal TSV_RX_SIG is transmitted to the internal circuit 260 of the lowermost chip SLICE0, buffering of the signal TSV_RX_SIG (being buffered or not being buffered) depends on enablement of the input buffer RX0. In the case where the signal TSV_RX_SIG from an outside is applied only to the uppermost chip SLICE2, an operation may be performed in such a manner that the remaining input buffers RX0 and RX1 corresponding to the uppermost chip SLICE2 are enabled and the input buffer RX2 is selectively enabled.

When the signal TSV_RX_SIG is transmitted to the Internal circuit 262 of the uppermost chip SLICE2, buffering of the signal TSV_RX_SIG depends on enablement of the input buffer RX2. In this way, enablement of the input buffers RX0, RX1 and RX2 may be selectively determined according as which internal circuit receives the signal TSV_RX_SIG.

In the same manner, in the case where the signal TSV_TX_SIG transmitted to an outside is outputted only from the lowermost chip SLICE0, an operation may be performed in such a manner that the output buffer TX0 corresponding to the lowermost chip SLICE0 is selectively enabled and the output buffers TX1 and TX2 corresponding to the remaining semiconductor chips SLICE1 and SLICE2 are disabled. When the signal TSV_TX_SIG outputted from the internal circuit 260 of the lowermost chip SLICE0 to the outside, buffering of the signal TSV_TX_SIG depends on enablement of the output buffer TX0. In the case where the signal TSV_TX_SIG transmitted to an outside is outputted only from the uppermost chip SLICE2, an operation may be performed in such a manner that the remaining output buffers TX0 and TX1 excluding the output buffer TX2 corresponding to the uppermost chip SLICE2 are enabled and the output buffer TX2 is selectively enabled. When the signal TSV_TX_SIG is outputted from the internal circuit 262 of the uppermost chip SLICE2 to the chip SLICE1 stacked there under, buffering of the signal TSV_TX_SIG depends on enablement of the output buffer TX2. In this way, enablement of the output buffers TX0, TX1 and TX2 may be selectively determined according to which internal circuit transmits the signal TSV_TX_SIG.

Hereafter, determination of the delay for compensation of the reception delay compensation units 221, 222 and 223 and the transmission delay compensation units 231, 232 and 233 will be described.

In FIG. 2A, it is assumed that all the input buffers RX0, RX1 and RX2 and all the chips SLICE0 to SLICE2 are enabled because the signal TSV_RX_SIG from an outside should be transferred to all the corresponding internal circuits 260 to 262.

The signal TSV_RX_SIG, which is to be transferred from the outside sequentially reaches the lowermost chip SLICE0, the intermediate chip SLICE1, and the uppermost chip SLICE2 in order of stack after sequentially buffered by the corresponding input buffers RX0, RX1 and RX2. Namely, the signal TSV_RX_SIG to be transmitted to the reception delay compensation unit 223 of the uppermost chip SLICE2 is transmitted through the longest delay, the signal TSV_RX_SIG to be transmitted to the reception delay compensation unit 221 of the lowermost chip SLICE0 is transmitted through the shortest delay, and the signal TSV_RX_SIG to be transmitted to the reception delay compensation unit 222 of the intermediate chip SLICE1 is transmitted through a delay between the longest delay and the shortest delay.

The respective reception delay compensation units 221, 222 and 223 operate so that the signal TSV_RX_SIG reaches the internal circuits 260, 261 and 262 with the same delay, despite that respective delay of the signal TSV_RX_SIG reaching the respective reception delay compensation units 221, 222 and 223 are different from one another. The respective reception delay compensation units 221, 222 and 223 operate so that the signal TSV_RX_SIG may reach the internal circuits 260 and 261 of the remaining semiconductor chips SLICE0 and SLICE1 with the delay of the signal TSV_RX_SIG reaching the internal circuit 262 of the uppermost chip SLICE2. For example, the reception delay compensation unit 223 of the uppermost chip SLICE2 bypasses the signal TSV_RX_SIG to the internal circuit 262 without any further delay. The reception delay compensation unit 222 of the intermediate chip SLICE1 delays the signal TSV_RX_SIG with delay corresponding to the input buffer RX2 of the uppermost chip SLICE2 and transfers it to the internal circuit 261. The reception delay compensation unit 221 of the lowermost chip SLICE0 delays the signal TSV_RX_SIG with delay corresponding to the input buffers RX2 and RX1 of the uppermost chip SLICE2 and the intermediate chip SLICE1 and transfers it to the internal circuit 260.

In FIG. 2B, it is assumed that all the output buffers TX0, TX1 and TX2 and all the chips SLICE0 to SLICE2 are enabled because the signal TSV_TX_SIG to an outside should be outputted from all of the corresponding internal circuits 260 to 262.

The signal TSV_TX_SIG, which is to be outputted to the outside sequentially reaches the uppermost chip SLICE2, the Intermediate chip SLICE1, and the lowermost chip SLICE0 in order of stack after sequentially buffered by the corresponding output buffers TX2, TX1 and TX0. Namely, the signal TSV_TX_SIG to be outputted from the transmission delay compensation unit 233 of the uppermost chip SLICE2 to the outside is transmitted through the longest delay, the signal TSV_TX_SIG to be outputted from the transmission delay compensation unit 231 of the lowermost chip SLICE0 to the outside is transmitted through the shortest delay, and the signal TSV_TX_SIG to be outputted from the transmission delay compensation unit 232 of the intermediate chip SLICE1 to the outside is transmitted through the delay between the longest delay and the shortest delay.

The respective transmission delay compensation units 231, 232 and 233 operate so that the signal TSV_TX_SIG reaches an output pad S of the device with the same delay, despite that respective delay of the signal TSV_TX_SIG from the chips SLICE0 to SLICE2 are different from one another. The respective transmission delay compensation units 231, 232 and 233 operate so that the signal TSV_TX_SIG outputted from the remaining semiconductor chips SLICE0 and SLICE1 may reach the output pad S with the delay of the signal TSV_TX_SIG outputted from the uppermost chip SLICE2 to reach the output pad S. For example, the transmission delay compensation unit 233 of the uppermost chip SLICE2 bypasses the signal TSV_TX_SIG from the internal circuit 262 to the TSV without any further delay. The transmission delay compensation unit 232 of the intermediate chip SLICE1 delays the signal TSV_TX_SIG from the internal circuit 261 with delay corresponding to the output buffer TX2 of the uppermost chip SLICE2 and transfers it to the TSV. The transmission delay compensation unit 231 of the lowermost chip SLICE0 delays the signal TSV_TX_SIG from the Internal circuit 260 with delay corresponding to the output buffers TX2 and TX1 of the uppermost chip SLICE2 and the intermediate chip SLICE1 and transfers it to the TSV.

In an embodiment illustrated in FIGS. 2A and 2B, each of the chips SLICE0 to SLICE2 may include one or more reception delay compensation units 221<1>, 221<2>, 222<1>, 222<2> and 223 and one or more transmission delay compensation units 231<1>, 231<2>, 232<1>, 232<2> and 233. The reception/transmission delay compensation units are connected to the corresponding internal circuits 260, 261, and 262. Each of the reception/transmission blocks 270, 271, 272, 280, 281 and 282 has two paths. One of the two paths is connected between corresponding reception/transmission delay compensation unit and input terminal of corresponding input/output buffer. The other path is connected between corresponding reception/transmission delay compensation unit and output terminal of corresponding input/output buffer. The reception/transmission blocks 270, 271, 272, 280, 281 and 282 include a plurality of first signal reception/transmission units 270<1>, 271<1>, 272<1>, 280<1>, 281<1> and 282<1> on the corresponding ones of the two paths and the TSV. The reception/transmission blocks 270, 271, 272, 280, 281 and 282 also include a plurality of second signal reception/transmission units 270<2>, 271<2>, 272<2>, 280<2>, 281<2> and 282<2> on the other path. The reception/transmission blocks 270, 271, 272, 280, 281 and 282 are configured to input/output the signals TSV_RX_SIG and TSV_TX_SIG between the internal circuits 260, 261 and 262 and the TSV. In other words, each of the reception/transmission blocks 270, 271, 272, 280, 281 and 282 has two paths, through which the signal TSV_RX_SIG may be inputted from the TSV to the corresponding reception delay compensation units 221<1>, 221<2>, 222<1>, 222<2> and 223, or through which the signal TSV_TX_SIG may be outputted to the TSV from the corresponding transmission delay compensation units 231<1>, 231<2>, 232<1>, 232<2> and 233.

For instance, the lowermost chip SLICE0 and the intermediate chip SLICE1 may communicate the signals TSV_RX_SIG and TSV_TX_SIG that are inputted/outputted through the paths of the reception/transmission blocks 270, 271, 272, 280, 281 and 282 connected to the output terminals of the corresponding input/output buffer RX0, RX1, TX0, and TX1, and therefore experience delays of the corresponding input/output buffers RX0, RX1, TX0, and TX1. However, the uppermost chip SLICE2 may communicate the signals TSV_RX_SIG and TSV_TX_SIG inputted/outputted through the paths of the reception/transmission blocks 270, 271, 272, 280, 281 and 282 connected to the input terminals of the corresponding input/output buffers RX2 and TX2, and therefore experience no delays of the corresponding input/output buffers RX2 and TX2. In this case, the intermediate chip SLICE1 and the uppermost chip SLICE2 may communicate the signals TSV_RX_SIG and TSV_TX_SIG without delay of the corresponding input/output buffers RX1, RX2, TX1, and TX2. Namely, the two-path structure of the reception/transmission blocks 270, 271, 272, 280, 281 and 282 may prevent delay of the signals TSV_RX_SIG and TSV_TX_SIG in communication between the adjacent chips.

Referring to an example illustrated in FIGS. 2A and 2B, each of the chips SLICE0 and SLICE1 includes two reception delay compensation units 221<1>, 221<2>, 222<1>, and 222<2> and two transmission delay compensation units 231<1>, 231<2>, 232<1>, and 232<2> while the uppermost chip SLICE2 includes one reception delay compensation unit 223 and one transmission delay compensation unit 233. The reception/transmission delay compensation units are connected to the corresponding internal circuits 260, 261, and 262.

As described above, each of the reception/transmission blocks 270, 271, 272, 280, 281 and 282 has two paths. In each of the chips SLICE0 and SLICE1, one of the two paths is connected between corresponding reception/transmission delay compensation unit and input terminal of corresponding input/output buffer. The other path is connected between corresponding reception/transmission delay compensation unit and output terminal of corresponding input/output buffer. In the uppermost chip SLICE2, the reception delay compensation unit 223 and the transmission delay compensation unit 233 are shared by the two paths.

The selection between a type that includes two reception/transmission delay compensation units like the chips SLICE0 and SLICE1 and a type that includes one reception/transmission delay compensation unit like the uppermost chip SLICE2 may depend on a circuit design.

When assuming that the type with two reception/transmission delay compensation units is implemented in all the chips SLICE0 to SLICE2, the configuration of the compensation delay blocks 220 and 230 may include a plurality of first delay variable reception compensation units 221<1>, 222<1> and 223<1>, a plurality of first delay variable transmission compensation units 231<1>, 232<1> and 233<1>, a plurality of second delay variable reception compensation units 221<2>, 222<2> and 223<2>, and a plurality of second delay variable transmission compensation units 231<2>, 232<2> and 233<2>.

The first reception delay compensation units 221<1>, 222<1> and 223<1> are respectively disposed between the internal circuits 260, 261 and 262 and the respective first signal reception units 270<1>, 271<1> and 272<1>. The delay for compensation of each of the first reception delay compensation units 221<1>, 222<1> and 223<1> is determined based on the stack information STACK_INFO. The first reception delay compensation units 221<1>, 222<1> and 223<1> operate so that the signal TSV_RX_SIG may reach the internal circuits 260 and 261 of the remaining semiconductor chips SLICE0 and SLICE1 with the same delay of the signal TSV_RX_SIG reaching the internal circuit 262 of the uppermost chip SLICE2.

The first transmission delay compensation units 231<1>, 232<1> and 233<1> are respectively disposed between the internal circuits 260, 261 and 262 and the respective first signal transmission units 280<1>, 281<1> and 282<1>. The delay for compensation of each of the first transmission delay compensation units 231<1>, 232<1> and 233<1> is determined based on the stack information STACK_INFO. The first transmission delay compensation units 231<1>, 232<1> and 233<1> operate so that the signal TSV_TX_SIG outputted from the remaining semiconductor chips SLICE0 and SLICE1 may reach the output pad S with the same delay of the signal TSV_TX_SIG outputted from the uppermost chip SLICE2 and reaching the output pad S.

The second reception delay compensation units 221<2>, 222<2> and 223<2> are respectively disposed between the internal circuits 260, 261 and 262 and the respective second signal reception units 270<2>, 271<2> and 272<2>. The delay for compensation of each of the second reception delay compensation units 221<2>, 222<2> and 223<2> is determined based on the stack information STACK_INFO. The second reception delay compensation units 221<2>, 222<2> and 223<2> operate in such a manner that the signal TSV_RX_SIG may reach the internal circuits 260 and 261 of the remaining semiconductor chips SLICE0 and SLICE1 with the delay of the same signal TSV_RX_SIG reaching the internal circuit 262 of the uppermost chip SLICE2.

The second transmission delay compensation units 231<2>, 232<2> and 233<2> are respectively disposed between the internal circuits 260, 261 and 262 and the respective second signal transmission units 280<2>, 281<2> and 282<2>. The delay for compensation of each of the second transmission delay compensation units 231<2>, 232<2> and 233<2> is determined based on the stack information STACK_INFO. The second transmission delay compensation units 231<2>, 232<2> and 233<2> operate so that the signal TSV_TX_SIG outputted from the remaining semiconductor chips SLICE0 and SLICE1 may reach the output pad S with the same delay of the signal TSV_TX_SIG outputted from the uppermost chip SLICE2 and reaching the output pad S.

When assuming that the type with one reception/transmission delay compensation unit is implemented in all the chips SLICE0 to SLICE2, the configuration of the delay compensation blocks 220 and 230 may include a plurality of common reception delay compensation units 221, 222 and 223 and a plurality of common transmission delay compensation units 231, 232 and 233.

The reception delay compensation units 221, 222 and 223 are respectively disposed between the internal circuits 260, 261 and 262 and the respective signal reception units 270, 271 and 272. The reception delay compensation units 221, 222 and 223 are shared by the two paths of respective signal reception units 270, 271 and 272. The delay for compensation of each of the reception delay compensation units 221, 222 and 223 is determined based on the stack information STACK_INFO. The reception delay compensation units 221, 222 and 223 operate in such a manner that the signal TSV_RX_SIG may reach the internal circuits 260 and 261 of the remaining semiconductor chips SLICE0 and SLICE1 with the same delay of the signal TSV_RX_SIG reaching the internal circuit 262 of the uppermost chip SLICE2.

The transmission delay compensation units 231, 232 and 233 are respectively disposed between the internal circuits 260, 261 and 262 and the respective signal transmission units 280, 281 and 282. The transmission delay compensation units 231, 232 and 233 are shared by the two paths of respective signal transmission units 280, 281 and 282. The delay for compensation of each of the transmission delay compensation units 231, 232 and 233 is determined based on the stack information STACK_INFO. The transmission delay compensation units 231, 232 and 233 operate in such a manner that the signal TSV_TX_SIG outputted from the remaining semiconductor chips SLICE0 and SLICE1 may reach the output pad S with the same delay of the signal TSV_TX_SIG outputted from the uppermost chip SLICE2 and reaching the output pad S.

Further, the types with one and two reception/transmission delay compensation units may be combined and selectively implemented in the chips SLICE0 to SLICE2. For example, the type with two reception/transmission delay compensation units may be implemented in the chips SLICE0 and SLICE1 and the type with one reception/transmission delay compensation unit may be implemented in the chip SLICE2.

The configuration and operation of the combined type may be same as those of the type with one reception/transmission delay compensation unit and the type with two reception/transmission delay compensation units.

<Second Embodiment>

FIGS. 3A to 3F are conceptual configuration diagrams of a semiconductor device that is configured by stacking a plurality of semiconductor chips, in accordance with a second embodiment of the present invention.

The device that is configured by stacking a plurality of chips, in accordance with the second embodiment shown in FIGS. 3A to 3F, has the following differences from the device that is configured by stacking a plurality of semiconductor chips, in accordance with the first embodiment shown in FIGS. 2A and 2B.

A plurality of TSVs is included in the device. That is to say, the device that is configured by stacking a plurality of chips, in accordance with the second embodiment, discloses an embodiment for the case where more than one TSV are included in the device. Each of the TSVs may convey different signals. Furthermore, each of the TSVs may be shared by responding one of plural groups of the chips. The chips in a group may communicate a signal with the shared TSV.

Based on these differences, the second embodiment will be described below in detail.

Figure 3A:
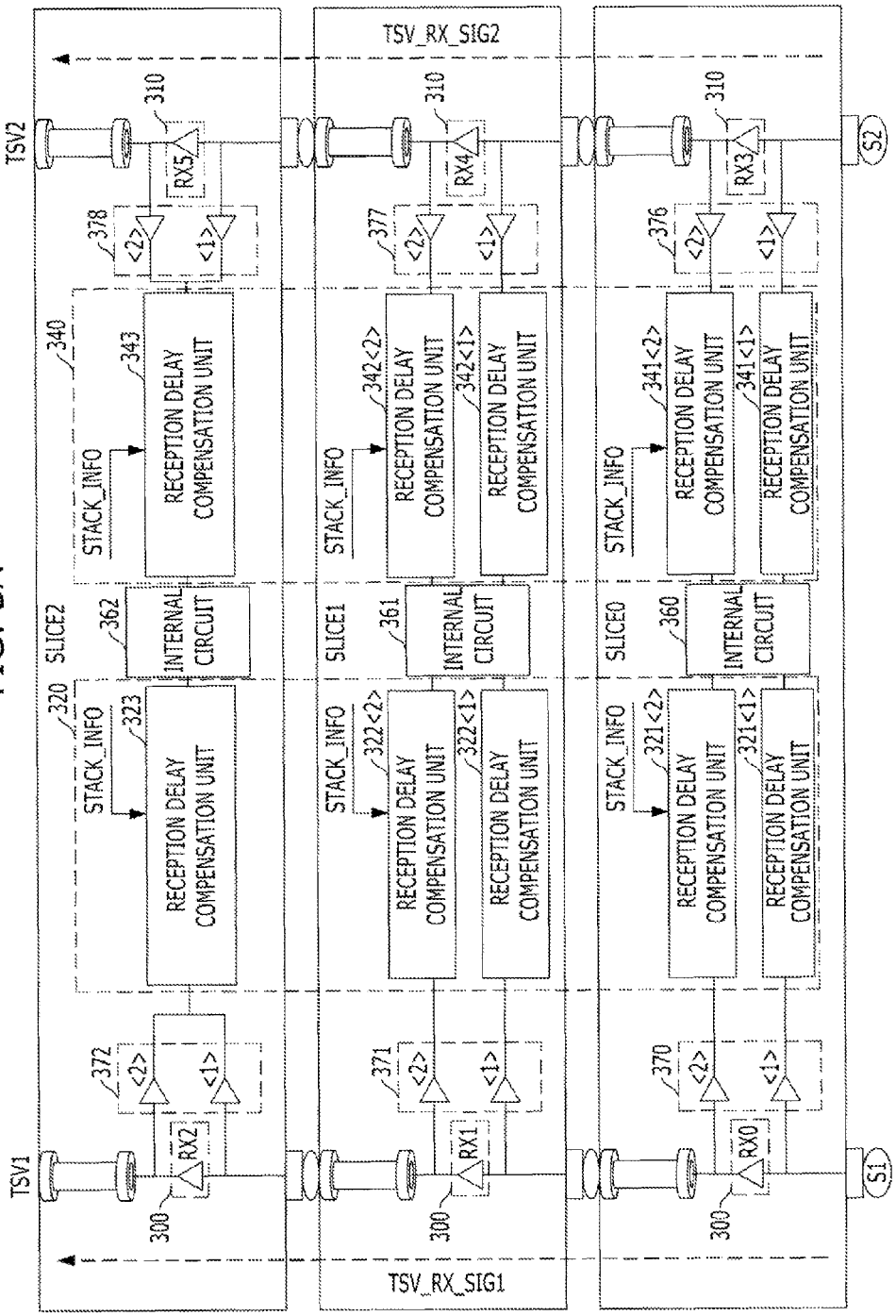
FIGS. 3A to 3G are conceptual configuration diagrams of a semiconductor device that is configured by stacking a plurality of semiconductor chips, in accordance with a second embodiment of the present invention.
Figure 3B:
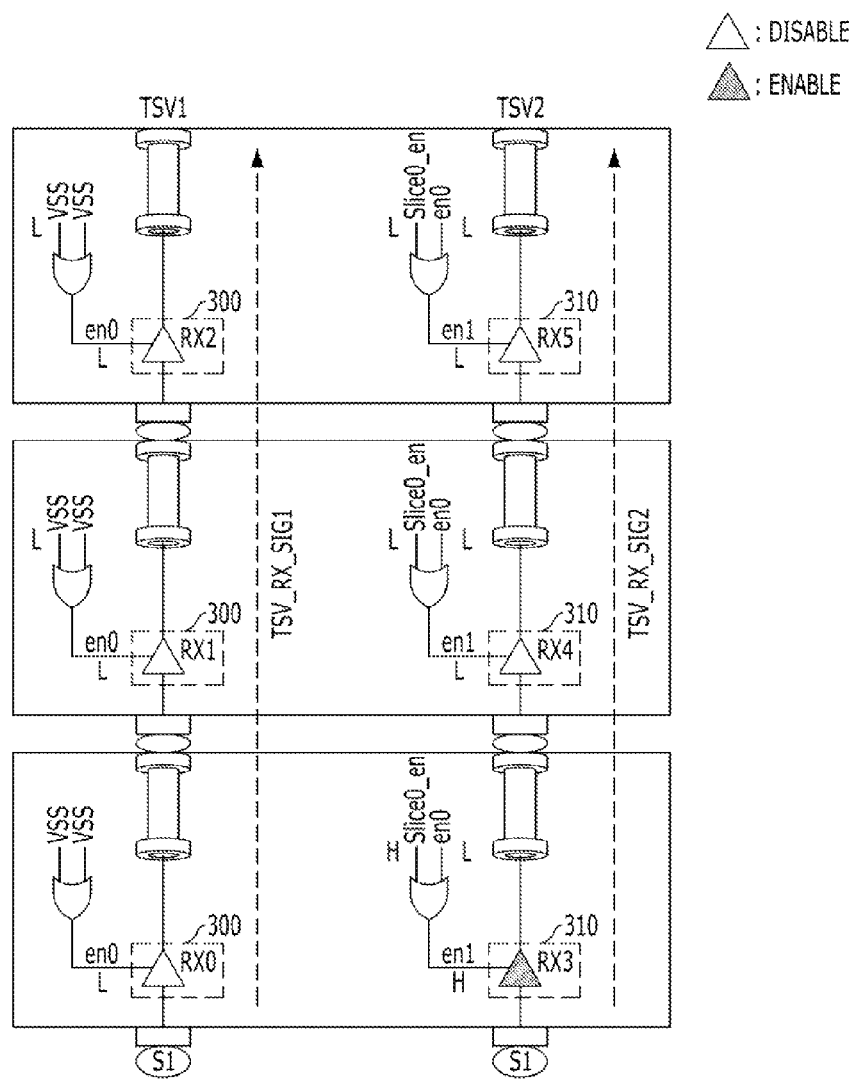
Figure 3C:
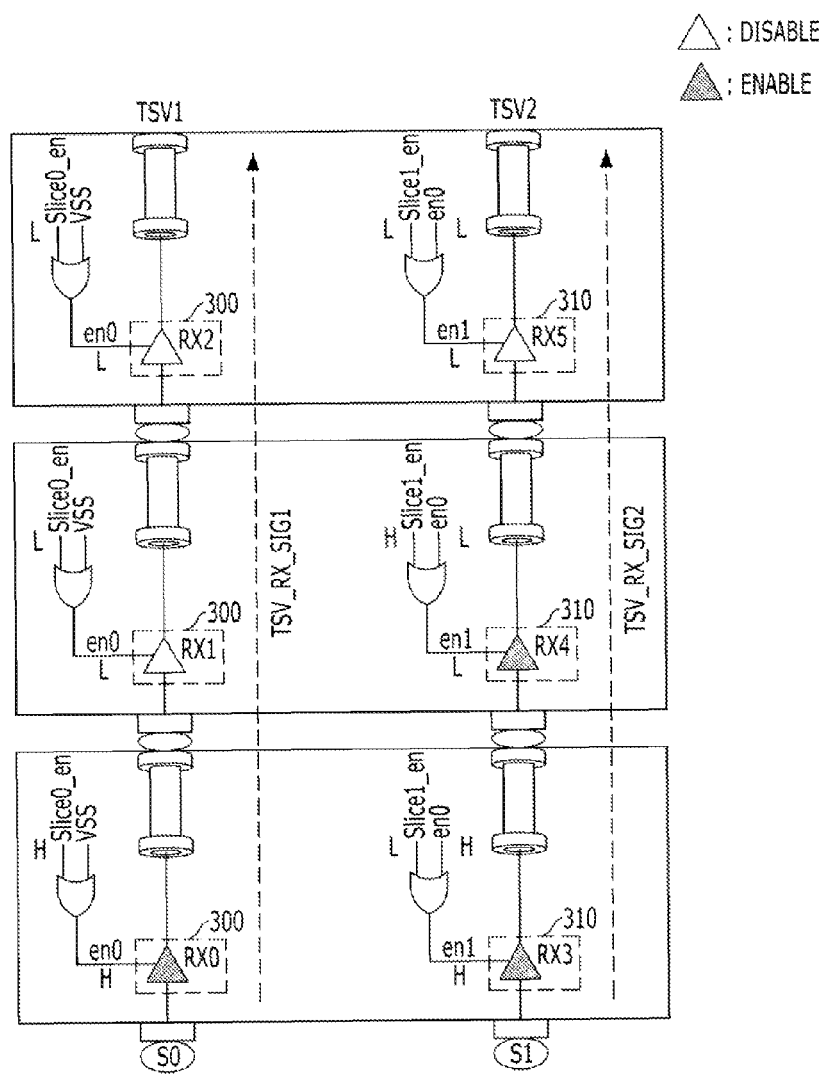

FIGS. 3A to 3C illustrates a circuit for compensating for the delay of a signal to be received by a device with a plurality of chips in stack structure in accordance with the second embodiment.

Figure 3D:
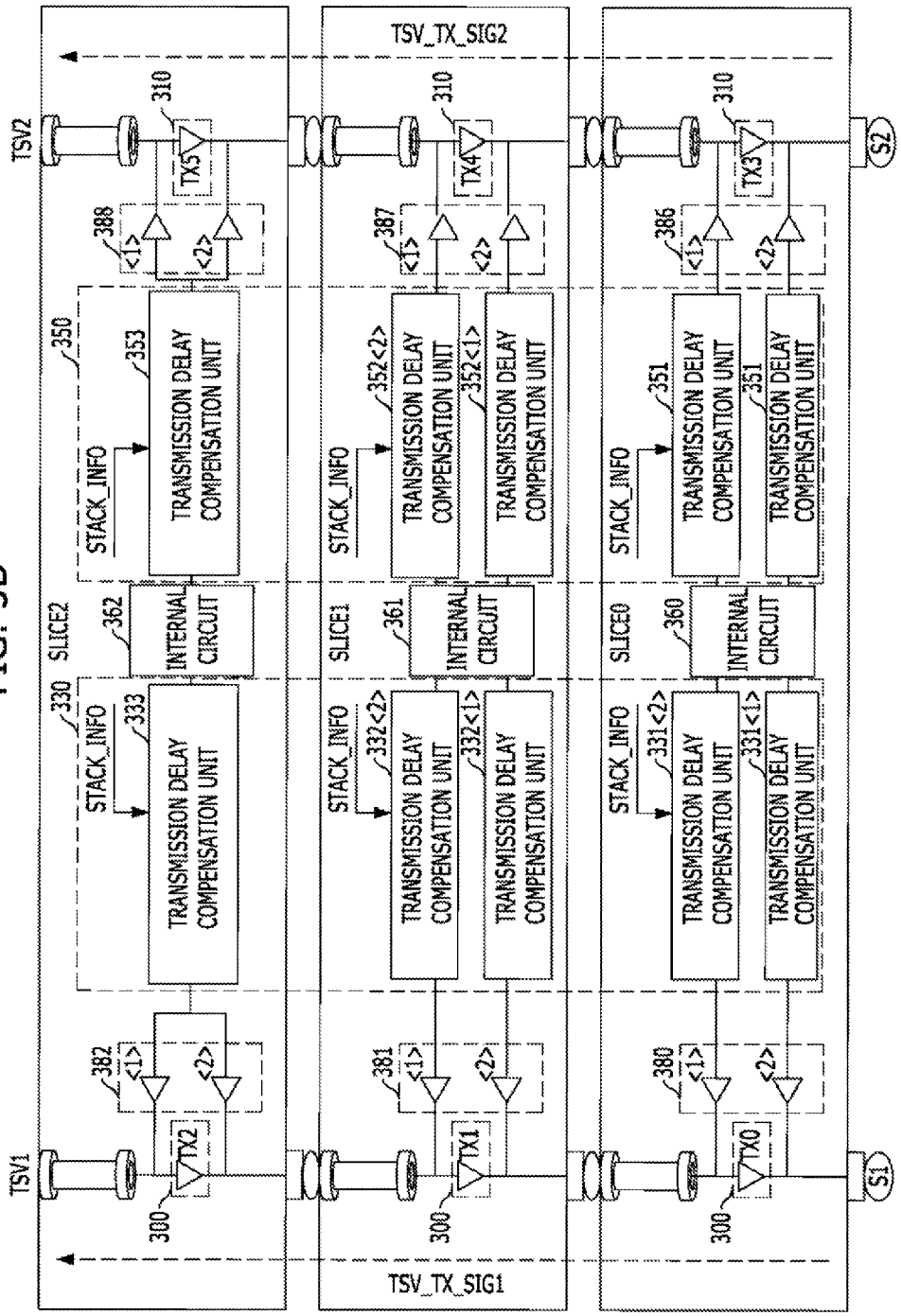
Figure 3E:
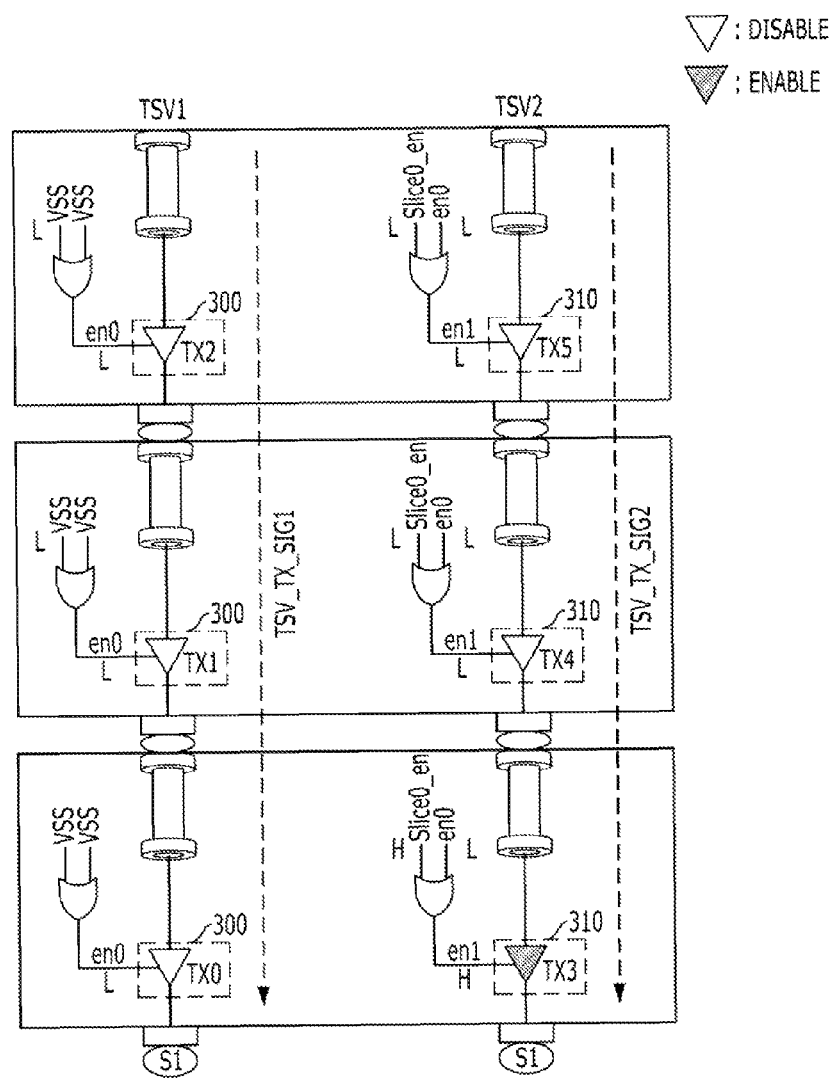
Figure 3F:
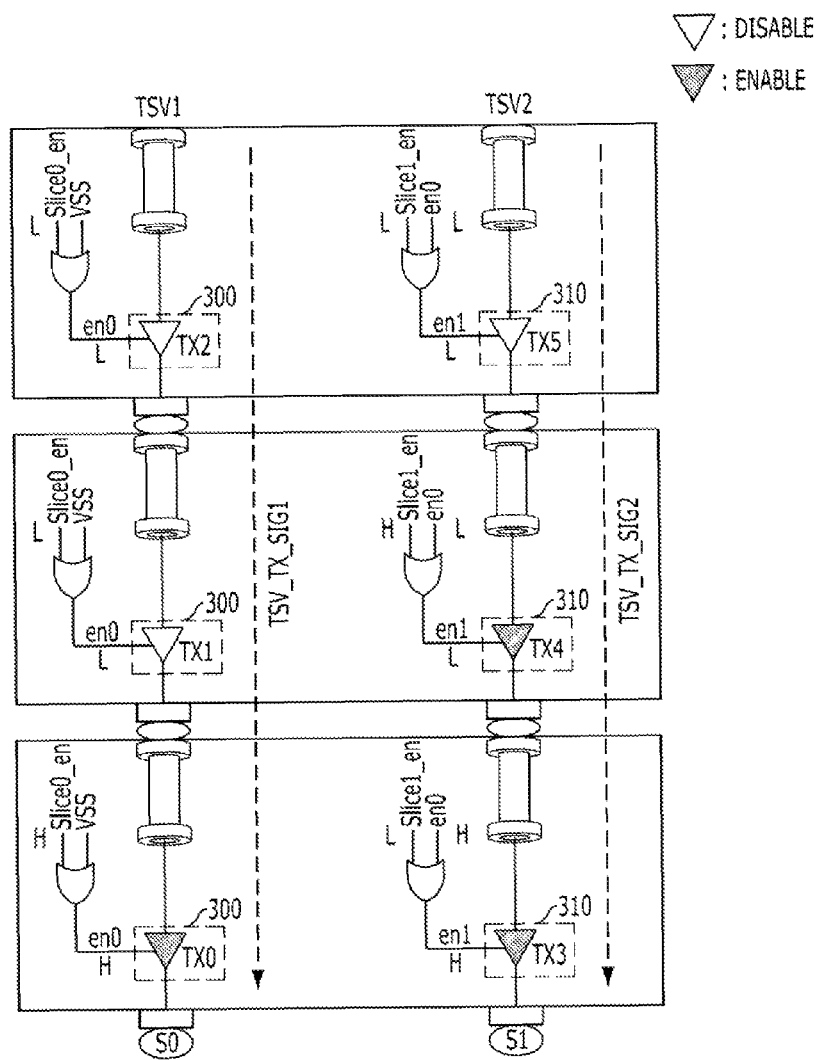

FIG. 3D to 3F illustrates a circuit for compensating for the delay of a signal to be transmitted from a device with a plurality of chips in stack structure in accordance with the second embodiment.

FIG. 3A illustrates two circuits of FIG. 2A sharing corresponding internal circuits 360 to 362. FIG. 3D illustrates two circuits of FIG. 2B sharing corresponding internal circuits 360 to 362. Referring to FIGS. 3A and 3D, the device in accordance with the second embodiment includes a plurality of chips SLICE0 to SLICE2, first buffering blocks 300, second buffering blocks 310, first delay compensation blocks 320 and 330, second delay compensation blocks 340 and 350, a plurality of first reception/transmission blocks 370, 371, 372, 380, 381 and 382, a plurality of second reception/transmission blocks 376, 377, 378, 386, 387 and 388, and internal circuits 360, 361 and 362. The first buffering blocks 300 include a plurality of input/output buffers RX0, RX1, RX2, TX0, TX1 and TX2. The second buffering blocks 310 include a plurality of input/output buffers RX3, RX4, RX5, TX3, TX4 and TX5. The first delay compensation blocks 320 and 330 include a plurality of first reception delay compensation units 321, 322 and 323 and a plurality of first transmission delay compensation units 331, 332 and 333. The second delay compensation blocks 340 and 350 include a plurality of second reception delay compensation units 341, 342 and 343 and a plurality of second transmission delay compensation units 351, 352 and 353.

The first and second buffering blocks 300 and 310 correspond to the buffering blocks 200 of FIGS. 2A and 2B. The first and second delay compensation blocks 320 to 350 correspond to the delay compensation blocks 220 and 230 of FIGS. 2A and 2B. The first and second reception/transmission blocks 370 to 372, 376 to 378, 380 to 382 and 386 to 388 correspond to the reception/transmission blocks 270 to 272 and 280 to 282 of FIGS. 2A and 2B. The internal circuits 360, 361 and 362 correspond to the internal circuits 260, 261 and 262 of FIGS. 2A and 2B. The input/output buffers RX0, RX1, RX2, TX0, TX1, TX2, RX3, RX4, RX5, TX3, TX4 and TX5 correspond to the input/output buffers RX0, RX1, RX2, TX0, TX1 and TX2 of FIGS. 2A and 2B. The first and second reception delay compensation units 321 to 323 and 341 to 343 correspond to the reception delay compensation units 221, 222 and 223 of FIG. 2A. The first and second transmission delay compensation units 331 to 333 and 351 to 353 correspond to the transmission delay compensation units 231, 232 and 233 of FIG. 2B. The first and second through-silicon vias TSV1 and TSV2 correspond to TSV of FIGS. 2A and 2B.

While it is illustrated in FIGS. 3A and 3D that the first delay compensation blocks 320 and 330 corresponding to the TSV1 and the second delay compensation blocks 340 and 350 corresponding to the TSV2 are separately dedicated to corresponding TSVs, namely TSV1 and TSV2, the first delay compensation blocks 320 and 330 or the second delay compensation blocks 340 and 350 may be shared by the TSVs according to a design. For example, for a chip using both the TSV1 and the TSV2, one of the first delay compensation blocks 320 and 330 and the second delay compensation blocks 340 and 350 may be implemented in such a way to be shared by both the TSV1 and the TSV2.

Selective enablement of the first input/output buffers RX0, RX1, RX2, TX0, TX1 and TX2 and the second input/output buffers RX3, RX4, RX5, TX3, TX4 and TX5 may vary according to circuit design.

Any input/output buffer that is on a path of TSV for signal communication may be continue to be enabled despite that a chip corresponding to the input/output buffer does not use the TSV of which there is the path for signal communication. For example, when the lowermost chip SLICE0 exclusively uses only the TSV1, the second delay compensation blocks 340 and 350 and the second reception/transmission blocks 376 and 386 of the lowermost chip SLICE0 are disabled, and the first delay compensation blocks 320 and 330 and the first reception/transmission blocks 371, 372, 381 and 382 of the remaining chips SLICE1 and SLICE2 are disabled. Although the lowermost chip SLICE0 does not use TSV2, the second input/output buffers RX3 and TX3 of the lowermost chip SLICE0 connected with the TSV2 should be enabled since the second input/output buffers RX3 and TX3 are on the path of TSV2 for any transmission of the signal TSV_RX_SIG2 between the outside and the chips SLICE1 and SLICE2. However, in the remaining chips SLICE1 and SLICE2, the first input/output buffers RX1 RX2, TX1 and TX2 connected with the TSV1 do not need to be enabled since the first input/output buffers RX1 RX2, TX1 and TX2 are not on the path of TSV1 for any transmission of the signal TSV_RX_SIG1 between the outside and the lowermost chip SLICE0.

Also, when the uppermost chip SLICE2 exclusively uses only the TSV2, the first delay compensation blocks 320 and 330 and the first reception/transmission blocks 372 and 382 of the uppermost chip SLICE2 are disabled, and the second delay compensation blocks 340 and 350 and the second reception/transmission blocks 376, 377, 386 and 387 of the remaining chips SLICE0 and SLICE1 are disabled. Although the remaining chips SLICE0 and SLICE1 do not use TSV2, all the second input/output buffers RX3, RX4, TX3 and TX4 connected with the TSV2 should be enabled since all the second input/output buffers RX3, RX4, TX3 and TX4 are on the path of TSV2 for any transmission of the signal TSV_RX_SIG2 between the outside and the uppermost chip SLICE2. On the other hand, in the uppermost chip SLICE2, the first input/output buffers RX2 and TX2 connected with the TSV1 do not need to be enabled since the first input/output buffers RX2 and TX2 are not on the path of TSV1 for any transmission of the signal TSV_RX_SIG1 between the outside and the remaining chips SLICE0 and SLICE1.

Selective enablement of the first input/output buffers RX0, RX1, RX2, TX0, TX1 and TX2 and the second input/output buffers RX3, RX4, RX5, TX3, TX4 and TX5 will be described below with reference to FIGS. 3B and 3C and FIGS. 3E and 3F.

FIGS. 3B and 3C illustrate two ways of transferring the signals TSV_RX_SIG1 and TSV_RX_SIG2 that are received by the device configured by stacking the chips SLICE0 to SLICE2 in accordance with the second embodiment.

In detail, referring to FIG. 3B, all of the first input buffers RX0, RX1 and RX2 are disabled, and among the second input buffers RX3, RX4 and RX5, only the second input buffer RX3 corresponding to the lowermost chip SLICE0 is enabled and the remaining second input buffers RX4 and RX5 are disabled.

In other words, the lowermost chip SLICE0 operates by receiving the signal TSV_RX_SIG1 applied through a pad S0 corresponding to the TSV1 as it is. Further, the intermediate chip SLICE1 and the uppermost chip SLICE2 are not inputted with any signals through the TSV1. Accordingly, although not shown in detail in FIG. 3B, the first delay compensation block 320 disposed in the lowermost chip SLICE0 does not need to perform any operation.

The intermediate chip SLICE1 operates by receiving the signal TSV_RX_SIG2, which is applied through a pad S1 corresponding to the TSV2 and which is then buffered through the second input buffer RX3 corresponding to the lowermost chip SLICE0. The uppermost chip SLICE2 does not receive any signal through the TSV2. Accordingly, although not shown in detail in FIG. 3B, in order to allow the signal TSV_RX_SIG2 applied through the TSV2 to be selectively transferred to the lowermost chip SLICE0 and the intermediate chip SLICE1, the second delay compensation block 340 disposed in the lowermost chip SLICE0 should apply the operation delay of the corresponding second input buffer RX3 to the signal TSV_RX_SIG2 transferred through the TSV2 and then transfer the resulting signal TSV_RX_SIG2 to the internal circuit 360, and the second delay compensation block 340 disposed in the intermediate chip SLICE1 does not need to perform any operation.

Of course, in the case where both the lowermost chip SLICE0 and the intermediate chip SLICE1 operate by receiving the signal TSV_RX_SIG2, which is buffered by the second input buffer RX3 of the lowermost chip SLICE0, not only the second delay compensation block 340 disposed in the intermediate chip SLICE1 does not need to perform any operation, but also the second delay compensation block 340 disposed in the lowermost chip SLICE0 does not need to perform any operation. Namely, in the case where the lowermost chip SLICE0 operates by receiving the signal TSV_RX_SIG2 buffered by the corresponding second input buffer RX3 and the intermediate chip SLICE1 operates by receiving the signal TSV_RX_SIG2 before the signal TSV_RX_SIG2 is buffered by the corresponding second input buffer RX4, since the lowermost chip SLICE0 and the intermediate chip SLICE1 receive the same signal TSV_RX_SIG2, the second delay compensation blocks 340 do not need to perform any operations.

Also, even in the case where the signal TSV_RX_SIG2 applied through the TSV2 is transferred to only the intermediate chip SLICE1, not only the second delay compensation block 340 disposed in the intermediate chip SLICE1 does not need to perform any operation, but also the second delay compensation block 340 disposed in the lowermost chip SLICE0 does not need to perform any operation. Namely, in the case where the intermediate chip SLICE1 exclusively uses the signal TSV_RX_SIG2 applied through the TSV2, since the lowermost chip SLICE0 does not use the signal TSV_RX_SIG2 applied through the TSV2, not only the second delay compensation block 340 disposed in the intermediate chip SLICE1 does not need to perform any operation, but also the second delay compensation block 340 disposed in the lowermost chip SLICE0 does not need to perform any operation.

For reference, while FIG. 3B shows a scheme in which a stack information signal SLICE0_EN is not directly used to generate a control signal EN0 and the control signal EN0 is generated by compulsorily using a ground voltage VSS because all the plurality of first input buffers RX0, RX1 and RX2 are disabled. This is nothing but a mere example. Various modifications may be made to such as a scheme of generating the control signal EN0 using the stack information signal SLICE0_EN, for example, a scheme of outputting a signal acquired by inverting the stack information signal SLICE0_EN as the control signal EN0.

Referring to FIG. 3C, among the first input buffers RX0, RX1 and RX2, only the first input buffer RX0 corresponding to the lowermost chip SLICE0 is enabled, and the remaining first input buffers RX1 and RX2 are disabled. Also, among the second input buffers RX3, RX4 and RX5, the second input buffers RX3 and RX4 corresponding to the lowermost chip SLICE0 and the intermediate chip SLICE1 are enabled, and the remaining second input buffer RX5 is disabled.

That is to say, the lowermost chip SLICE0 operates by receiving the signal TSV_RX_SIG1 applied through the pad S0 corresponding to the TSV1 as it is, or operates by receiving the signal TSV_RX_SIG1 applied through the pad S0 corresponding to the TSV1 and then buffered through the corresponding first input buffer RX0. Further, the intermediate chip SLICE1 operates by receiving the signal TSV_RX_SIG1 applied through the pad S0 corresponding to the TSV1 and then buffered through the first input buffer RX0 corresponding to the lowermost chip SLICE0. The uppermost chip SLICE2 does not receive any signal through the TSV1. Accordingly, it may be seen that operations of the first input buffers RX0, RX1 and RX2 corresponding to the TSV1 shown in FIG. 3C may be set in the same manner as the operations of the second input buffers RX3, RX4 and RX5 corresponding to the TSV2 shown in FIG. 3B, and accordingly, it may be seen that operations of the first delay compensation block 320 shown in FIG. 3C may be set in the same manner as the operations of the second delay compensation block 340 shown in FIG. 3B.

The uppermost chip SLICE2 operates by receiving the signal TSV_RX_SIG2 applied through the pad S1 corresponding to the TSV2 and then buffered through the second input buffers RX3 and RX4 corresponding to the lowermost chip SLICE0 and the intermediate chip SLICE1.

Therefore, while not shown in detail in FIG. 3C, in order to allow the signal TSV_RX_SIG2 applied through the TSV2 to be selectively transferred to the chips SLICE0 to SLICE2, the second delay compensation block 340 disposed in the lowermost chip SLICE0 should apply the operation delay of the corresponding second input buffer RX3 and the operation delay of the second input buffer RX4 of the intermediate chip SLICE1 to the signal TSV_RX_SIG2 transferred through the TSV2 and then transfer the resulting signal TSV_RX_SIG2 to the internal circuit 360, and the second delay compensation block 340 disposed in the intermediate chip SLICE1 should apply the operation delay of the corresponding second input buffer RX4 to the signal TSV_RX_SIG2 transferred through the TSV2 and then transfer the resulting signal TSV_RX_SIG2 to the internal circuit 360. The second delay compensation block 340 disposed in the uppermost chip SLICE2 does not need to perform any operation.

In the case where both the uppermost chip SLICE2 and the intermediate chip SLICE1 operate by receiving the signal TSV_RX_SIG2 buffered by the second input buffer RX4 of the intermediate chip SLICE1, the second delay compensation block 340 disposed in the intermediate chip SLICE1 and the second delay compensation block 340 disposed in the uppermost chip SLICE2 do not need to perform any operations.

In other words, in the case where the intermediate chip SLICE1 operates by receiving the signal TSV_RX_SIG2 buffered by the corresponding second input buffer RX4 and the uppermost chip SLICE2 operates by receiving the signal TSV_RX_SIG2 before the signal TSV_RX_SIG2 is buffered by the corresponding second input buffer RX5, since the intermediate chip SLICE1 and the uppermost chip SLICE2 receive the same signal TSV_RX_SIG2, the second delay compensation blocks 340 do not need to perform any operations.

In the case where the lowermost chip SLICE0 operates by receiving the signal TSV_RX_SIG2 buffered by the corresponding second input buffer RX3, the second delay compensation block 340 disposed in the lowermost chip SLICE0 should apply the operation delay of the second input buffer RX4 of the intermediate chip SLICE1 to the signal TSV_RX_SIG2 transferred through the TSV2 and then transfer the resulting signal TSV_RX_SIG2 to the internal circuit 360. However, in the case where the lowermost chip SLICE0 operates by receiving the signal TSV_RX_SIG2 applied through the pad S1 corresponding to the TSV2 as it is, the second delay compensation block 340 disposed in the lowermost chip SLICE0 should apply the sum of the operation delay of the corresponding second input buffer RX3 and the operation delay of the second input buffer RX4 of the intermediate chip SLICE1 to the signal TSV_RX_SIG2 transferred through the TSV2 and then transfer the resulting signal TSV_RX_SIG2 to the internal circuit 360.

Also, even in the case where the signal TSV_RX_SIG2 applied through the TSV2 is transferred to only the intermediate chip SLICE1, not only the second delay compensation block 340 disposed in the intermediate chip SLICE1 does not need to perform any operation, but also the second delay compensation block 340 disposed in the lowermost chip SLICE0 does not need to perform any operation. Namely, in the case where the intermediate chip SLICE1 exclusively uses the signal TSV_RX_SIG2 applied through the TSV2, since the lowermost chip SLICE0 does not use the signal TSV_RX_SIG2 applied through the TSV2, not only the second delay compensation block 340 disposed in the Intermediate chip SLICE1 does not need to perform any operation, but also the second delay compensation block 340 disposed in the lowermost chip SLICE0 does not need to perform any operation.

Referring to FIGS. 3E and 3F, it may be seen that whether to enable the plurality of respective first output buffers TX0, TX1 and TX2 and whether to enable the respective second output buffers TX3, TX4 and TX5 are differently controlled to explain different ways of transferring the signals TSV_TX_SIG1 and TSV_TX_SIG2 that are to be transmitted in the device configured by stacking the chips SLICE0 to SLICE2 in accordance with the second embodiment.

In detail, referring to FIG. 3E, all the first output buffers TX0, TX1 and TX2 are disabled, and among the second output buffers TX3, TX4 and TX5, only the second output buffer TX3 corresponding to the lowermost chip SLICE0 is enabled, and the remaining second output buffers TX4 and TX5 are disabled.

In other words, the lowermost chip SLICE0 outputs the signal TSV_TX_SIG1 that is to be outputted through the TSV1 through the pad S0 corresponding to the TSV1 as it is. Further, the intermediate chip SLICE1 and the uppermost chip SLICE2 do not output any signals through the TSV1. Accordingly, although not shown in detail in FIG. 3E, the first delay compensation block 320 disposed in the lowermost chip SLICE0 does not need to perform any operation.

The intermediate chip SLICE1 buffers the signal TSV_TX_SIG2 that is to be outputted through the TSV2 through the second output buffer TX3 corresponding to the lowermost chip SLICE0, and then outputs the resulting signal TSV_TX_SIG2 through the pad S1 corresponding to the TSV2. The uppermost chip SLICE2 does not output any signal through the TSV2. Accordingly, although not shown in detail in FIG. 3E, in order to allow the signal TSV_TX_SIG2 that is to be outputted through the TSV2 to be selectively outputted from the lowermost chip SLICE0 and the intermediate chip SLICE1, the second delay compensation block 350 disposed in the intermediate chip SLICE1 should apply the operation delay of the second output buffer TX3 of the lowermost chip SLICE0 to the signal TSV_TX_SIG2 transferred through the TSV2 and then output the resulting signal TSV_TX_SIG2, and the second delay compensation block 350 disposed in the lowermost chip SLICE0 does not need to perform any operation.

Of course, in the case where both the signals TSV_TX_SIG2 to be outputted through the TSV2 from the lowermost chip SLICE0 and the intermediate chip SLICE1 are outputted by being buffered by the second output buffer TX3 of the lowermost chip SLICE0, not only the second delay compensation block 350 disposed in the intermediate chip SLICE1 does not need to perform any operation, but also the second delay compensation block 350 disposed in the lowermost chip SLICE0 does not need to perform any operation. Namely, in the case where the signal TSV_TX_SIG2 that is to be outputted through the TSV2 from the lowermost chip SLICE0 is outputted by being buffered by the corresponding second output buffer TX3 and the signal TSV_TX_SIG2 to be outputted through the TSV2 from the intermediate chip SLICE1 is outputted as well by being buffered by only the second output buffer TX3 of the lowermost chip SLICE0, since the lowermost chip SLICE0 and the intermediate chip SLICE1 output the same signal TSV_TX_SIG2 through the TSV2, the second delay compensation blocks 350 do not need to perform any operations.

Also, even in the case where the signal TSV_TX_SIG2 that is to be outputted through the TSV2 is outputted from only the intermediate chip SLICE1, not only the second delay compensation block 350 disposed in the intermediate chip SLICE1 does not need to perform any operation, but also the second delay compensation block 350 disposed in the lowermost chip SLICE0 does not need to perform any operation. Namely, in the case where the signal TSV_TX_SIG2 to be outputted through the TSV2 from the intermediate chip SLICE1 exclusively uses the TSV2, since the lowermost chip SLICE0 does not output any signal through the TSV2, not only the second delay compensation block 350 disposed in the intermediate chip SLICE1 does not need to perform any operation, but also the second delay compensation block 350 disposed in the lowermost chip SLICE0 does not need to perform any operation.

For reference, while FIG. 3E shows a scheme in which the stack information signal SLICE0_EN is not directly used to generate the control signal EN0, and the control signal EN0 is generated by compulsorily using a ground voltage VSS because all of the first output buffers TX0, TX1 and TX2 are disabled, this is nothing but a mere example, and various modifications may be made to a scheme of generating the control signal EN0 using the stack information signal SLICE0_EN, for example, a scheme of outputting a signal acquired by inverting the stack information signal SLICE0_EN as the control signal EN0.

Referring to FIG. 3F, among the first output buffers TX0, TX1 and TX2, only the first output buffer TX0 corresponding to the lowermost chip SLICE0 is enabled and the remaining first output buffers TX1 and TX2 are disabled. Also, among the second output buffers TX3, TX4 and TX5, the second output buffers TX3 and TX4 corresponding to the lowermost chip SLICE0 and the intermediate chip SLICE1 are enabled and the remaining second output buffer TX5 is disabled.

That is to say, the signal TSV_TX_SIG1 that is to be outputted through the TSV1 from the lowermost chip SLICE0 is outputted through the pad S0 corresponding to the TSV1 as it is, or is outputted through the pad S0 corresponding to the TSV1 after being buffered through the corresponding first output buffer TX0. Further, the signal TSV_TX_SIG1 that is to be outputted through the TSV1 from the Intermediate chip SLICE1 is outputted after being buffered through the first output buffer TX0 corresponding to the lowermost chip SLICE0. The uppermost chip SLICE2 does not output any signal through the TSV1. Accordingly, it may be seen that operations of the first output buffers TX0, TX1 and TX2 corresponding to the TSV1 shown in FIG. 3F may be set in the same manner as the operations of the second output buffers TX3, TX4 and TX5 corresponding to the TSV2 shown in FIG. 3E. Accordingly, it may be seen that operations of the first delay compensation block 330 shown in FIG. 3F may be set in the same manner as the operations of the second delay compensation block 350 shown in FIG. 3E.

The signal TSV_TX_SIG2 to be outputted through the TSV2 from the uppermost chip SLICE2 is outputted after being buffered through the second output buffers TX3 and TX4 corresponding to the intermediate chip SLICE1 and the lowermost chip SLICE0.

Therefore, while not shown in detail in FIG. 3F, in order to allow the signal TSV_TX_SIG2, which is to be outputted through the TSV2, to be selectively outputted from the chips SLICE0 to SLICE2, the second delay compensation block 350 disposed in the uppermost chip SLICE2 should apply the sum of the operation delay of the second output buffer TX4 of the intermediate chip SLICE1 and the operation delay of the second output buffer TX3 of the lowermost chip SLICE0 to the signal TSV_TX_SIG2 transferred through the TSV2 and then output the resulting signal TSV_TX_SIG2 to the pad S1 corresponding to the TSV2, and the second delay compensation block 350 disposed in the intermediate chip SLICE1 should apply the operation delay of the second output buffer TX3 of the lowermost chip SLICE0 to the signal TSV_TX_SIG2 transferred through the TSV2 and then output the resulting signal TSV_TX_SIG2 to the pad S1 corresponding to the TSV2. The second delay compensation block 350 disposed in the lowermost chip SLICE0 does not need to perform any operation.

In the case where both the signal TSV_TX_SIG2 that is to be outputted through the TSV2 from the uppermost chip SLICE2 and the signal TSV_TX_SIG2 that is to be outputted through the TSV2 from the intermediate chip SLICE1 are outputted to the pad S1 corresponding to the TSV2 after being buffered by the second output buffer TX3 of the lowermost chip SLICE0, the second delay compensation block 350 disposed in the intermediate chip SLICE1 and the second delay compensation block 350 disposed in the uppermost chip SLICE2 do not need to perform any operations.

In other words, in the case where the signal TSV_TX_SIG2 that is to be outputted through the TSV2 from the lowermost chip SLICE0 is outputted after being buffered by the corresponding second output buffer TX3 and the signal TSV_TX_SIG2 to be outputted through the second through-silicon via TSV from the intermediate chip SLICE1 is outputted by being buffered by only the second output buffer TX3 of the lowermost chip SLICE0 without being buffered by the corresponding second output buffer TX4, since the signals TSV_TX_SIG2 to be outputted through the TSV2 are outputted through the same path from the intermediate chip SLICE1 and the lowermost chip SLICE0, the second delay compensation blocks 350 do not need to perform any operations.

The second delay compensation block 350 disposed in the uppermost chip SLICE2 should apply the sum of the operation delay of the second output buffer TX4 of the intermediate chip SLICE1 and the operation delay of the second output buffer TX3 of the lowermost chip SLICE0 to the signal TSV_TX_SIG2 transferred through the TSV2 and then output the resulting signal TSV_TX_SIG2.

Also, even in the case where the signal TSV_TX_SIG2 that is to be outputted through the TSV2 is outputted from only the intermediate chip SLICE1, not only the second delay compensation block 350 disposed in the Intermediate chip SLICE1 does not need to perform any operation, but also the second delay compensation block 350 disposed in the lowermost chip SLICE0 does not need to perform any operation. Namely, in the case where the signal TSV_TX_SIG2 that is to be outputted through the TSV2 from the intermediate chip SLICE1 exclusively uses the TSV2, since the lowermost chip SLICE0 does not output any signal through the TSV2, not only the second delay compensation block 350 disposed in the intermediate chip SLICE1 does not need to perform any operation, but also the second delay compensation block 350 disposed in the lowermost chip SLICE0 does not need to perform any operation.

Figure 3G:
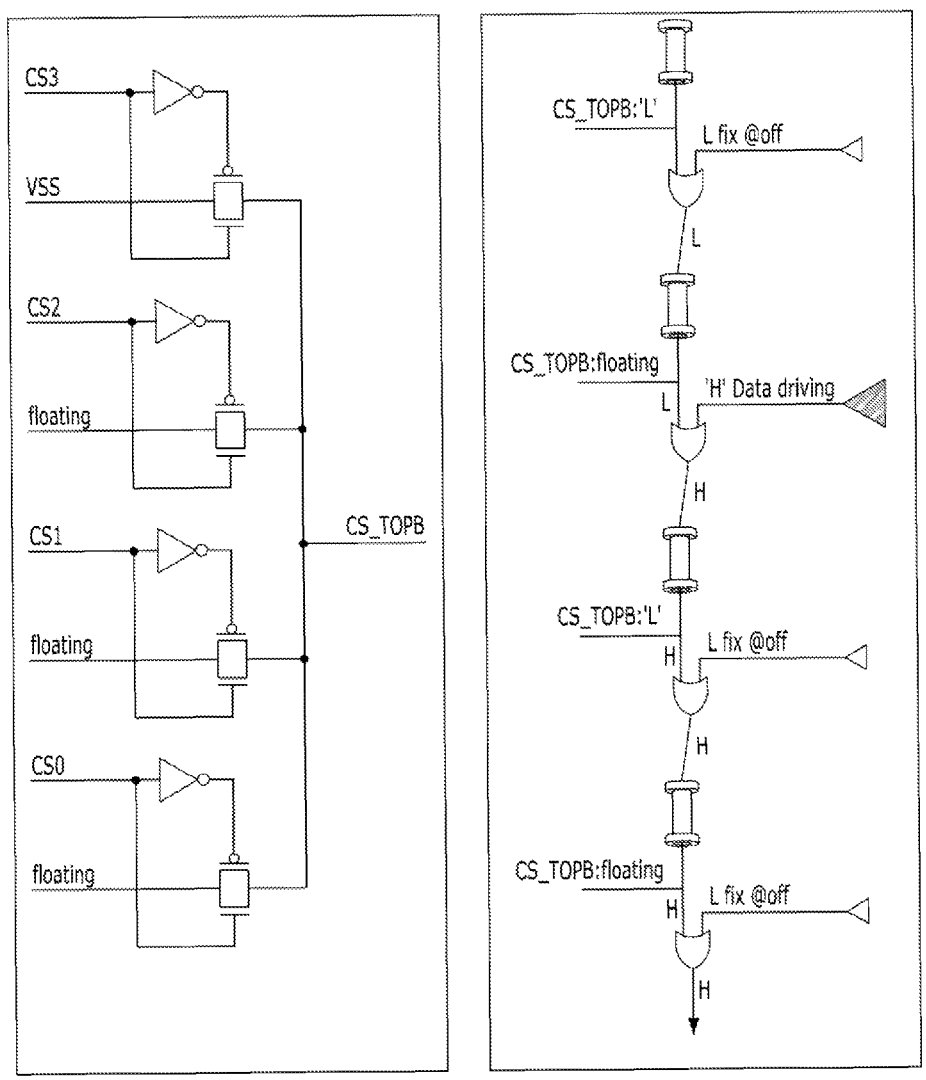

For reference, while it may be seen that configurations using OR gates are disclosed in FIGS. 3B, 3C, 3E and 3F to control whether to enable the first input/output buffers RX0, RX1, RX2, TX0, TX1 and TX2 and the second input/output buffers RX3, RX4, RX5, TX3, TX4 and TX5, this is nothing but a mere example, and whether to enable the first input/output buffers RX0, RX1, RX2, TX0, TX1 and TX2 and the second input/output buffers RX3, RX4, RX5, TX3, TX4 and TX5 may be controlled by using other logic gates in other embodiments. Furthermore, while it may be seen that the first input/output buffers RX0, RX1, RX2, TX0, TX1 and TX2 and the second input/output buffers RX3, RX4, RX5, TX3, TX4 and TX5 include tri-state buffers in FIGS. 3B, 3C, 3E and 3F, this is nothing but a mere example, and the first input/output buffers RX0, RX1, RX2, TX0, TX1 and TX2 and the second input/output buffers RX3, RX4, RX5, TX3, TX4 and TX5 may include general buffer gates without a high-Z state as shown in FIG. 3G in other embodiments.

<Third Embodiment>

Figure 4:
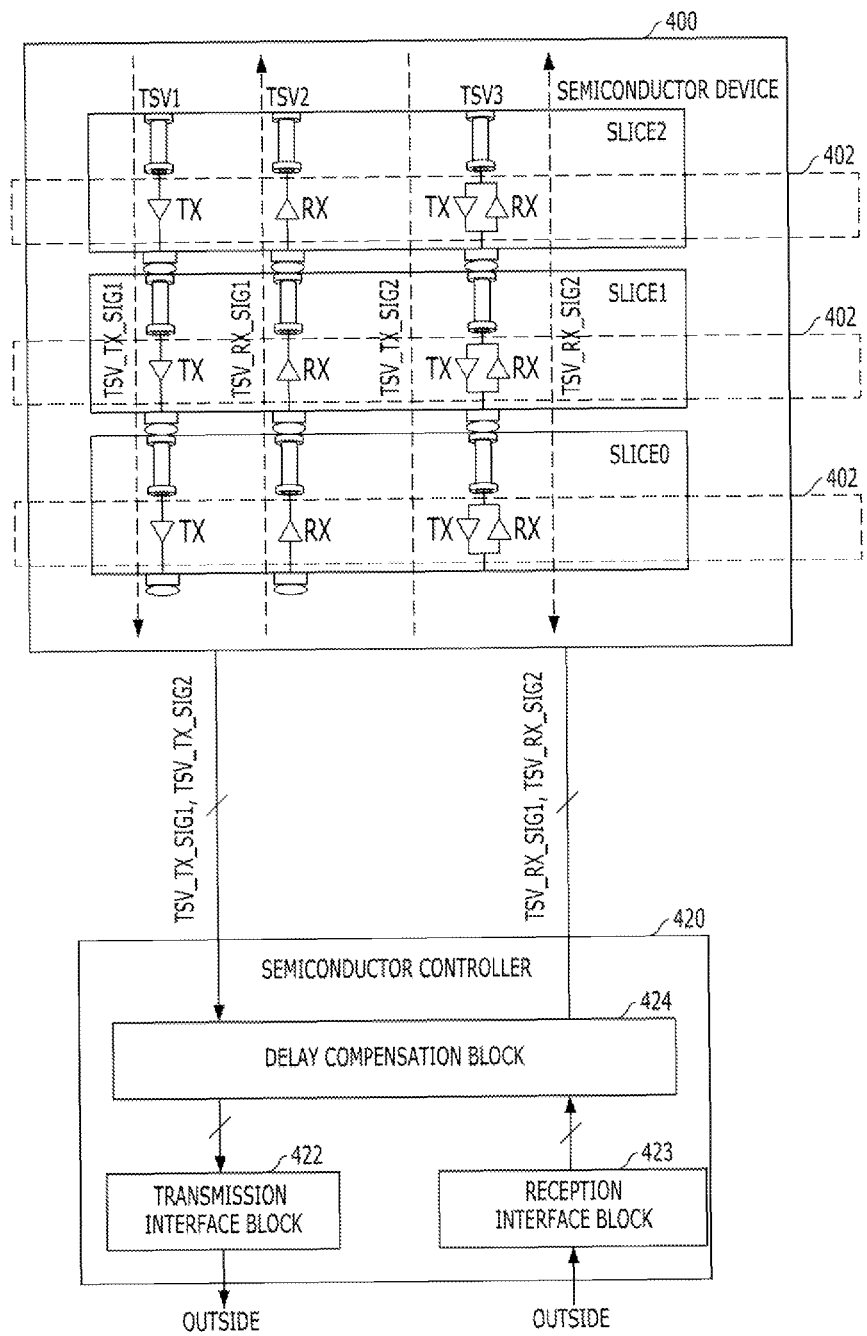
FIG. 4 is a conceptual configuration diagram of a semiconductor system including a semiconductor device that is configured by stacking a plurality of semiconductor chips and a semiconductor controller for controlling the device, in accordance with a third embodiment of the present invention.

FIG. 4 is a conceptual configuration diagram of a semiconductor system including a semiconductor device that is configured by stacking a plurality of semiconductor chips and a semiconductor controller for controlling the device, in accordance with a third embodiment of the present invention.

The system of FIG. 4 includes a centralized delay compensation block 424 corresponding to the delay compensation blocks 220, 230, 320, 330, 340 and 350 of FIGS. 2A, 2B, 3A, and 3D.

That is to say, component elements for compensating for the delay of the signals to be communicated through TSVs of the device, which substitute for the delay compensation blocks 220 and 230 or the first delay compensation blocks 320 and 330 and the second delay compensation blocks 340 and 350, are integrated and included in a controller instead of the device.

The other component elements disposed in the paths of TSVs in a semiconductor device to buffer signals to be transferred, which substitute the buffering blocks 200 or the first buffering blocks 300 and the second buffering blocks 310, are included in the device similar to the first and second embodiments.

Based on these differences, the third embodiment will be described below in detail.

Referring to FIG. 4, the system in accordance with the third embodiment includes a semiconductor device 400 and a semiconductor controller 420. The device 400 includes a plurality of semiconductor chips SLICE0 to SLICE2, a plurality of through-silicon vias TSV1, TSV2 and TSV3, and buffering blocks 402. The semiconductor controller 420 includes reception interface 423 and transmission interface 422, and a delay compensation block 424.

The chips SLICE0 to SLICE2 in a stack structure communicate signals TSV_RX_SIG1, TSV_TX_SIG1, TSV_RX_SIG2 and TSV_TX_SIG2 through the TSV1, TSV2 and TSV3. The controller 420 is configured to forward the signals TSV_TX_SIG1 and TSV_TX_SIG2 from the device 400 to the outside and to forward the signals TSV_RX_SIG1 and TSV_RX_SIG2 to the device 400 from the outside. The controller 420 is configured to compensate for the delay of the signals TSV_RX_SIG1, TSV_TX_SIG1, TSV_RX_SIG2 and TSV_TX_SIG2 in the chips SLICE0 to SLICE2 based on stack information STACK_INFO.

The device 400 includes the buffering blocks 402 disposed in the paths of the TSV1, TSV2 and TSV3 in respective correspondence to the chips SLICE0 to SLICE2. The buffering blocks 402 are configured to buffer the signals TSV_RX_SIG1, TSV_TX_SIG1, TSV_RX_SIG2 and TSV_TX_SIG2. While not directly illustrated in the device 400 shown in FIG. 4, internal circuits are respectively included in the chips SLICE0 to SLICE2, and a plurality of reception/transmission blocks for receiving and transmitting the signals TSV_RX_SIG1, TSV_TX_SIG1, TSV_RX_SIG2 and TSV_TX_SIG2 between the internal circuits and the TSV1, TSV2 and TSV3 are included in the chips SLICE0 to SLICE2.

The internal circuits and the transmission/reception blocks included in the chips SLICE0 to SLICE2 correspond to those of the first and second embodiment illustrated in FIGS. 2A, 2B, 3A and 3D.

The buffering blocks 402 include a plurality of input and output buffers RX and TX and are configured to buffer the signals TSV_RX_SIG1, TSV_TX_SIG1, TSV_RX_SIG2 and TSV_TX_SIG2. Selective enablement of the input/output buffers RX and TX and the transmission/reception blocks depends on the stack information STACK_INFO.

The stack information STACK_INFO may be set through an internally disposed memory register set (MRS), fuse setting, or a test mode.

The semiconductor controller 420 includes transmission/reception interfaces 422 and 423 configured to transmit the signals TSV_TX_SIG1 and TSV_TX_SIG2 from the device 400 to the outside and to receive the signals TSV_RX_SIG1 and TSV_RX_SIG2 from the outside to the device 400. The delay compensation block 424 is configured to compensate for delay differences in timings, which is caused due to the buffering blocks 402, at which the signals TSV_RX_SIG1 and TSV_RX_SIG2 from the controller 420 are transferred to the internal circuits of the chips SLICE0 to SLICE2, and the signals TSV_TX_SIG1 and TSV_TX_SIG2 from the internal circuits of the chips SLICE0 to SLICE2 are transferred to the controller 420, based on stack information STACK_INFO.

The delay compensation block 424 includes a reception delay compensation unit (not illustrated) configured to compensate for the variable delay of the signals TSV_RX_SIG1 and TSV_RX_SIG2, which are transmitted to the internal circuits of the device 400 from the controller 420, based on the stack information STACK_INFO, on the basis of a delay timing difference of each of the signals TSV_RX_SIG1 and TSV_RX_SIG2 from the lowermost chip SLICE0 to the uppermost chip SLICE2, wherein the delay timing difference of each of the signals TSV_RX_SIG1 and TSV_RX_SIG2 may vary according to selective enablement of the chips SLICE0 to SLICE2. The delay compensation block 424 further includes a transmission delay compensation unit (not illustrated) configured to compensate for the variable delay of the signals TSV_TX_SIG1 and TSV_TX_SIG2 which are transmitted from the Internal circuits of the device 400 to the controller 420, based on the stack information STACK_INFO, on the basis of a delay timing difference of each of the signals TSV_TX_SIG1 and TSV_TX_SIG2 from the uppermost chip SLICE2 to the lowermost chip SLICE0, wherein the delay timing difference of each of the signals TSV_TX_SIG1 and TSV_TX_SIG2 may vary according to selective enablement of the chips SLICE0 to SLICE2.

Operations for compensating for the delay of the signals TSV_RX_SIG1, TSV_TX_SIG1, TSV_RX_SIG2 and TSV_TX_SIG2 communicated between the controller 420 and the device 400 in accordance with the third embodiment may be exemplarily described as follows, on the basis of the configuration mentioned above. It is assumed that all the buffering blocks 402 included in the device 400 are enabled during operations for compensating for the delay of the signals TSV_RX_SIG1, TSV_TX_SIG1, TSV_RX_SIG2 and TSV_TX_SIG2.

The TSV1 may be used to transfer an outbound signal or the signal TSV_TX_SIG1 from the device 400 to the controller 420. The TSV2 may be used to transfer an inbound signal or the signal TSV_RX_SIG1 from the controller 420 to the device 400. The TSV3 may be used for both of the outbound signal and the inbound signal communicated between the device 400 and the controller 420. In FIG. 4, the outbound signal and the inbound signal of TSV3 are illustrated as the signal TSV_TX_SIG2 and the signal TSV_RX_SIG2, respectively.

The inbound and outbound signals may be communicated between the device 400 and the outside through the controller 420.

In the case where the signals TSV_RX_SIG1 and TSV_RX_SIG2 are transmitted from the controller 420 to the device 400, the signals TSV_RX_SIG1 and TSV_RX_SIG2 are applied to the TSV2 and TSV3.

The delay compensation unit 424 operates in such a manner that each of the signals TSV_RX_SIG1 and TSV_RX_SIG2 from the controller 420 reaches the each of the internal circuits of the chips SLICE0 to SLICE2 with the same delay. In other words, the delay compensation unit 424 operates in such a manner that the signals TSV_RX_SIG1 and TSV_RX_SIG2 may reach the internal circuits of the remaining semiconductor chips SLICE0 and SLICE1 with the same delay of the signals TSV_RX_SIG1 and TSV_RX_SIG2 reaching the internal circuit of the uppermost chip SLICE2.

As an example of TSV_RX_SIG1, in case where the signal TSV_RX_SIG1 transferred through the TSV2 is applied to the uppermost chip SLICE2, the delay compensation unit 424 bypasses the signal TSV_RX_SIG1 to the device 400 without any further delay.

In case where the signal TSV_RX_SIG1 transferred through the TSV2 is applied to the intermediate chip SLICE1, the delay compensation unit 424 delays the signal TSV_RX_SIG1 with delay corresponding to the input buffer RX of the uppermost chip SLICE2 and transfers it to the device 400. In case where the signal TSV_RX_SIG1 transferred through the TSV2 is applied to the lowermost chip SLICE0, the delay compensation unit 424 delays the signal TSV_RX_SIG1 with delay corresponding to the input buffers RXs of the uppermost chip SLICE2 and the intermediate chip SLICE1 and transfers it to the device 400.

That is to say, because the signals TSV_RX_SIG1 and TSV_RX_SIG2, which are transmitted from the controller 420 to the device 400, are transmitted in the state in which appropriate delays are compensated based on the chips SLICE0 to SLICE2, when the signals TSV_RX_SIG1 and TSV_RX_SIG2 are inputted, the signals TSV_RX_SIG1 and TSV_RX_SIG2, which reach the internal circuits of the chips SLICE0 to SLICE2 through the TSV2 and TSV3, may have same delay.

In the case where the signals TSV_TX_SIG1 and TSV_TX_SIG2 are transmitted from the device 400 to the controller 420, the signals TSV_TX_SIG1 and TSV_TX_SIG2 are applied to the first and third through-silicon vias TSV1 and TSV3.

The delay compensation unit 424 operates in such a manner that each of the signals TSV_TX_SIG1 and TSV_TX_SIG2 reaches the transmission interface 422 of the controller 420 with the same delay. In other words, the delay compensation unit 424 operates in such a manner that the signals TSV_TX_SIG1 and TSV_TX_SIG2 outputted from the remaining semiconductor chips SLICE0 and SLICE1 may reach the transmission interface 422 with the same delay of the signals TSV_TX_SIG1 and TSV_TX_SIG2, which are outputted from the uppermost chip SLICE2, reaching the transmission interface 422.

As an example of TSV_TX_SIG1, in case where the signal TSV_TX_SIG1 transferred through the TSV1 is outputted from the uppermost chip SLICE2 to the outside, the delay compensation unit 424 bypasses the signal TSV_TX_SIG1 from the device 400 to the transmission interface 422 without any further delay.

In case where the signal TSV_TX_SIG1 transferred through the TSV1 is outputted from the intermediate chip SLICE1 to the outside, the delay compensation unit 424 delays the signal TSV_TX_SIG1 from the device 400 with delay corresponding to the output buffer TX of the uppermost chip SLICE2 and transfers it to the transmission interface 422. In case where the signal TSV_TX_SIG1 transferred through the TSV1 is outputted from the lowermost chip SLICE0 to the outside, the delay compensation unit 424 delays the signal TSV_TX_SIG1 from the device 400 with delay corresponding to the output buffers TXs of the uppermost chip SLICE2 and the intermediate chip SLICE1 and transfers it to the transmission interface 422.

That is to say, because the signals TSV_TX_SIG1 and TSV_TX_SIG2 transmitted from the device 400 to the outside or the transmission interface 422 of the controller 420 are transmitted in the state in which appropriate delay are compensated based on the chips SLICE0 to SLICE2, when the signals TSV_TX_SIG1 and TSV_TX_SIG2 are outputted, the signals TSV_TX_SIG1 and TSV_TX_SIG2, which are outputted from the chips SLICE0 to SLICE2 to the transmission interface 422 of the controller 420, may have same delay.

In the semiconductor system in accordance with the third embodiment as described above, while the operations for compensating for the delay of the signals TSV_RX_SIG1, TSV_TX_SIG1, TSV_RX_SIG2 and TSV_TX_SIG2 to be communicated between the controller 420 and the device 400 may have further various embodiments according to whether the buffering blocks 402 in the device 400 are enabled, since this was sufficiently described above through the first embodiment and the second embodiment, further detailed descriptions thereof will be omitted herein.

As is apparent from the above descriptions, in the embodiments, because the delay of a signal transmitted through a through-silicon via in a semiconductor device with a stack structure may be predicted in advance and may be compensated for, it may be possible to efficiently perform an operation of transmitting a signal through a through-silicon via.

Moreover, it may be possible to effectively support an operation of a high bandwidth even in the device with a stack structure.

Although various embodiments have been described for illustrative purposes, it will be apparent to those skilled in the art that various changes and modifications may be made without departing from the spirit and scope of the invention as defined in the following claims.

For instance, positions and kinds of the logic gates and transistors exemplified in the above-described embodiment may be differently realized according to the polarities of the signals inputted thereto.

What is claimed is:

1. A semiconductor device comprising:
   a plurality of semiconductor chips in a stack structure; and
   a through-silicon via suitable for passing through the plurality of chips and transfer a signal from or to one or more of the plurality of chips,
   wherein each of the plurality of chips includes:
   a buffering block disposed in path of the through-silicon via, and suitable for buffering the signal;
   an internal circuit; and
   a delay compensation block suitable for applying delay corresponding to the buffering blocks of the plurality of chips to the signal,
   wherein the delay compensation block of each of the plurality of chips compensates for delay difference of the signal transferred to and from the internal circuit of the chip, due to operations of the buffering block based on stack information for distinguishing the plurality of chips.

2. The semiconductor device according to claim 1, wherein each of the plurality of chips further comprises:
   a reception block suitable for inputting the signal from the through-silicon via to the delay compensation block; and
   a transmission block suitable for outputting the signal from the delay compensation block to the through-silicon via.

3. The semiconductor device according to claim 2, wherein the delay compensation block comprises:
   a reception delay compensation unit, wherein delay for compensation of which is determined in response to the stack information, on the basis of the delay differences of the signal transferred upwards to an uppermost chip of the plurality of chips; and
   a transmission delay compensation unit, wherein delay for compensation of which is determined in response to the stack information, on the basis of the delay differences of the signal transferred downwards to a lowermost chip of the plurality of chips.

4. The semiconductor device according to claim 2,
   wherein enablement of the buffering block depends on the stack information and includes an input buffer in a direction toward an uppermost chip of the plurality of chips and an output buffer in a direction toward a lowermost chip of the plurality of chips.

5. The semiconductor device according to claim 4, wherein the reception block comprises:
   a first signal reception unit connected to an input terminal of the input buffer; and
   a second signal reception unit connected to an output terminal of the input buffer, and
   wherein the transmission block comprises:
   a first signal transmission unit connected to an input terminal of the output buffer; and
   a second signal transmission unit connected to an output terminal of the output buffer.

6. The semiconductor device according to claim 5, wherein the delay compensation block comprises:
   a first reception delay compensation unit connected the first signal reception unit;
   a first transmission delay compensation unit connected to the first signal transmission unit;
   a second reception delay compensation unit connected to the second signal reception unit; and
   a second transmission delay compensation unit connected to the second signal transmission unit,
   wherein the first and second reception delay compensation units compensate for delay difference of the signal transferred to the internal circuit of the chip based on the delay differences of the signal transferred to an uppermost chip of the plurality of chips, the delay being caused by the input buffer, and
   wherein the first and second transmission delay compensation units compensate for delay difference of the signal transferred from the internal circuit of the chip based on the delay differences of the signal transferred to a lowermost chip of the plurality of chips, the delay being caused by the output buffer.

7. The semiconductor device according to claim 5, wherein the delay compensation block comprise:
   a common reception delay compensation unit connected the first and second signal reception units; and
   a common transmission delay compensation unit connected to the first and second signal transmission units,
   wherein the common reception delay compensation unit compensates for delay difference of the signal transferred to the internal circuit of the chip based on the delay differences of the signal transferred to an uppermost chip of the plurality of chips, the delay being caused by the input buffer, and
   wherein the common transmission delay compensation unit compensates for delay difference of the signal transferred from the internal circuit of the chip based on the delay differences of the signal transferred to a lowermost chip of the plurality of chips, the delay being caused by the output buffer.

8. The semiconductor device according to claim 5,
   wherein each of the delay compensation blocks in some of the plurality of chips comprise:
   a first reception delay compensation unit connected the first signal reception unit;
   a first transmission delay compensation unit connected to the first signal transmission unit;
   a second reception delay compensation unit connected to the second signal reception unit; and
   a second transmission delay compensation unit connected to the second signal transmission unit,
   wherein each of the delay compensation blocks in rest of the plurality of chips comprise:
   a common reception delay compensation unit connected the first and second signal reception units; and
   a common transmission delay compensation unit connected to the first and second signal transmission units, and
   wherein the first and second reception delay compensation units and the common reception delay compensation unit compensate for delay difference of the signal transferred to the internal circuit of the chip based on the delay differences of the signal transferred to an uppermost chip of the plurality of chips, the delay being caused by the input buffer, and
   wherein the first and second transmission delay compensation units and the common transmission delay compensation unit compensate for delay difference of the signal transferred from the internal circuit of the chip based on the delay differences of the signal transferred to a lowermost chip of the plurality of chips, the delay being caused by the output buffer.

9. A semiconductor device comprising:
a plurality of semiconductor chips in a stack structure;
a first through-silicon via suitable for passing through the plurality of chips and transfer a first signal from or to one or more of the plurality of chips; and
a second through-silicon via suitable for passing through the plurality of chips and transfer a second signal from or to one or more of the plurality of chips,
wherein each of the plurality of chips includes:
first and second buffering blocks, disposed in path of the first and second through-silicon vias, respectively, suitable for buffering the signals;
an internal circuit; and
first and second delay compensation blocks suitable for applying delay corresponding to the first and second buffering blocks of the plurality of chips to the respective signals,
wherein the first and second delay compensation blocks of the plurality of chips compensate for delay difference of the respective signals transferred to and from the internal circuit of the chip, due to operations of the first and second buffering blocks, based on stack information for distinguishing the plurality of chips.

10. The semiconductor device according to claim 9, wherein each of the plurality of chips further includes:
first and second reception blocks, connected to the first and second delay compensation blocks, respectively, suitable for inputting the signals from the first and second through-silicon vias to the first and second delay compensation blocks, respectively; and
first and second transmission blocks, connected to the first and second delay compensation blocks, respectively, suitable for outputting the signals from the first and second delay compensation blocks to the first and second through-silicon vias, respectively.

11. The semiconductor device according to claim 10, wherein, in correspondence to a predetermined chip among the plurality of chips that exclusively uses the first through-silicon via, the second delay compensation blocks and the second reception/transmission blocks in the predetermined chip are disabled, and the first compensation delay blocks and the first reception/transmission blocks of remaining chips are disabled, and
wherein, in correspondence to the predetermined chip among the plurality of chips that exclusively uses the second through-silicon via, the first compensation delay blocks and the first reception/transmission blocks in the predetermined chip are disabled, and the second compensation delay blocks and the second reception/transmission blocks of remaining chips are disabled.

12. The semiconductor device according to claim 10, wherein the first delay compensation blocks comprise:
a first reception delay compensation unit, delay for compensation of which is determined based on the stack information, on the basis of the delay differences of the first signal transferred to an uppermost chip of the plurality of chips; and
a first transmission delay compensation unit, delay for compensation of which is determined based on the stack information, on the basis of the delay differences of the first signal transferred to a lowermost chip of the plurality of chips.

13. The semiconductor device according to claim 12, wherein the second delay compensation blocks comprise:
a second reception delay compensation unit, delay for compensation of which is determined based on the stack information, on the basis of the delay differences of the second signal transferred to an uppermost chip of the plurality of chips; and
a second transmission delay compensation unit, delay for compensation of which is determined based on the stack information, on the basis of the delay differences of the second signal transferred to a lowermost chip of the plurality of chips.

14. The semiconductor device according to claim 10, wherein enablement of each of the first and second buffering block depends on the stack information, and
wherein each of the first and second buffering blocks includes an input buffer in a direction toward an uppermost chip of the plurality of chips and an output buffer in a direction toward a lowermost chip of the plurality of chips.

15. The semiconductor device according to claim 14, wherein each of the input buffers and the output buffers of each of the first and second buffering blocks is independently determined to be enabled.

16. A semiconductor system comprising:
a semiconductor device; and
a semiconductor controller,
wherein the semiconductor device includes:
a plurality of semiconductor chips in a stack structure; and
a through through-silicon via suitable for passing through the plurality of chips and transfer a signal from or to one or more of the plurality of chips, and
wherein the semiconductor controller communicates the signal with the semiconductor device and compensates for delay differences of the signal transmitted through the through-silicon via based on stack information for distinguishing the plurality of chips.

17. The semiconductor system according to claim 16, wherein each of the plurality of chips includes:
a buffering block disposed in path of the through-silicon via, and suitable for buffering the signal;
an internal circuit;
a reception block connected to the internal circuit and suitable for inputting the signal from the through-silicon via to the internal circuit; and
a transmission block connected to the internal circuit and suitable for outputting the signal from the internal circuit to the through-silicon via.

18. The semiconductor system according to claim 17, wherein enablement of the buffering block depends on the stack information and includes an input buffer in a direction toward an uppermost chip of the plurality of chips and an output buffer in a direction toward a lowermost chip of the plurality of chips.

19. The semiconductor system according to claim 17, wherein the semiconductor controller comprises:
an interface suitable for outputting the signal to the through-silicon via and for receiving the signal from the through-silicon via; and
a delay compensation block suitable for compensating for delay differences of the signal transmitted through the through-silicon via to the corresponding chips, resulting from operations of the buffering block, based on the stack information.

20. The semiconductor system according to claim 19, wherein the delay compensation block comprises:
a transmission delay compensation unit suitable for compensating for delay of the signal transmitted to the device through the interface, based on the stack information, on the basis of the delay difference of the signal transmitted to a lowermost chip of the plurality of chips; and a reception delay compensation unit suitable for compensating for delay of the signal received from the device through the interface, based on the stack information, on the basis of the delay difference of the signal transmitted to an uppermost chip of the plurality of chips.

* * * * *